United States Patent
Islam et al.

(10) Patent No.: US 12,062,410 B2
(45) Date of Patent: Aug. 13, 2024

(54) APPARATUS, SYSTEM AND METHOD TO SENSE A LOGIC STATE OF A MEMORY CELL IN A THREE-DIMENSIONAL MEMORY DEVICE

(71) Applicant: Intel Corporation, Santa Clara, CA (US)

(72) Inventors: Ashraf B. Islam, El Dorado Hills, CA (US); Jaydip Bharatkumar Patel, Folsom, CA (US); Yasir Mohsin Husain, Folsom, CA (US); Balaji Srinivasan, Folsom, CA (US); Nicolas L. Irizarry, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 734 days.

(21) Appl. No.: 17/114,407

(22) Filed: Dec. 7, 2020

(65) Prior Publication Data
US 2022/0180905 A1    Jun. 9, 2022

(51) Int. Cl.
*G11C 16/06* (2006.01)
*G11C 7/06* (2006.01)
(Continued)

(52) U.S. Cl.
CPC .............. *G11C 7/065* (2013.01); *G11C 7/106* (2013.01); *G11C 7/1087* (2013.01); *G11C 7/12* (2013.01); *G11C 7/14* (2013.01); *G11C 8/08* (2013.01)

(58) Field of Classification Search
CPC ........................................................ G11C 7/12
(Continued)

(56) References Cited

U.S. PATENT DOCUMENTS

2005/0030809 A1* 2/2005 Vimercati .............. G11C 16/24
365/222

* cited by examiner

*Primary Examiner* — Hoai V Ho
(74) *Attorney, Agent, or Firm* — Alliance IP, LLC

(57) ABSTRACT

A method, apparatus and system. The method includes: generating a feedback voltage $V_{FB}$ in a feedback circuit coupled to one of a bitline node (BL) or a wordline node (WL) of each of a plurality of memory cells of a memory array, the feedback voltage to, in a thresholded state of said each of the memory cells, counteract a decrease in an absolute value of a voltage $V_{vdm}$ at said one of the BL or WL; generating, in a reference circuit, one of a reference voltage $V_{REF}$ to track a feedback voltage of the feedback circuit or a mirror current $I_{MFBmirror}$ to track a current $I_{cell}$ through said each of the memory cells; and providing one of values for both $V_{FB}$ and $V_{REF}$, or for an output voltage $V_{apsout}$ corresponding to $I_{MFBmirror}$, to a sense circuitry, the sense circuitry to determine a logic state of said each of the memory cells based on a comparison of $V_{FB}$ with $V_{REF}$ or based on $V_{apsout}$.

20 Claims, 14 Drawing Sheets

(51) Int. Cl.
  *G11C 7/10*   (2006.01)
  *G11C 7/12*   (2006.01)
  *G11C 7/14*   (2006.01)
  *G11C 8/08*   (2006.01)
(58) Field of Classification Search
  USPC .................................................. 365/185.21
  See application file for complete search history.

APPARATUS, SYSTEM AND METHOD TO SENSE A LOGIC STATE OF A MEMORY CELL IN A THREE-DIMENSIONAL MEMORY DEVICE

FIELD

The present disclosure relates in general to the field of computer development, and more specifically, to mechanisms to sense a logic state of a memory cell.

BACKGROUND

A storage device may include non-volatile memory, such as multi-stack three dimensional (3D) crosspoint memory cells or arrays.

Current read circuits for memory cells in memory arrays can lead to voltage drops across the cell after thresholding, which voltage drop can lead to unreliable reads. Mechanisms are needed to address the voltage drop in order to ensure more reliable reads after thresholding.

When a memory cell is thresholded (subjected to a threshold voltage) for reading purposes (to determine the logic state of the cell), a problem may arise in that the voltage across the cell (the voltage difference $\Delta V$ between a voltage at the bitline LBL and a voltage at the wordline LWL) may collapse. $\Delta V$ correlates with the demarcation voltage (VDM) used to determine the logic state of the cell, which would therefore also decrease (what we will call the "VDM collapse issue"). However, if VDM collapses, the necessary read current $I_{Read}$ across the memory cell would no longer be sustainable, resulting in possible read errors.

Some memory circuitries use an active demarcation voltage (VDM) source follower (SF) scheme designed to mitigate VDM collapse issue and to therefore increase current delivery post thresholding in a memory cell, such as in a 3DXP memory cell. This feedback architecture uses a feedback mechanism to reduce the voltage drop. This architecture however poses new challenges to the design a sensing scheme, especially because voltages within the feedback mechanism may be subject to process, voltage and/or temperature (PVT) variations.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
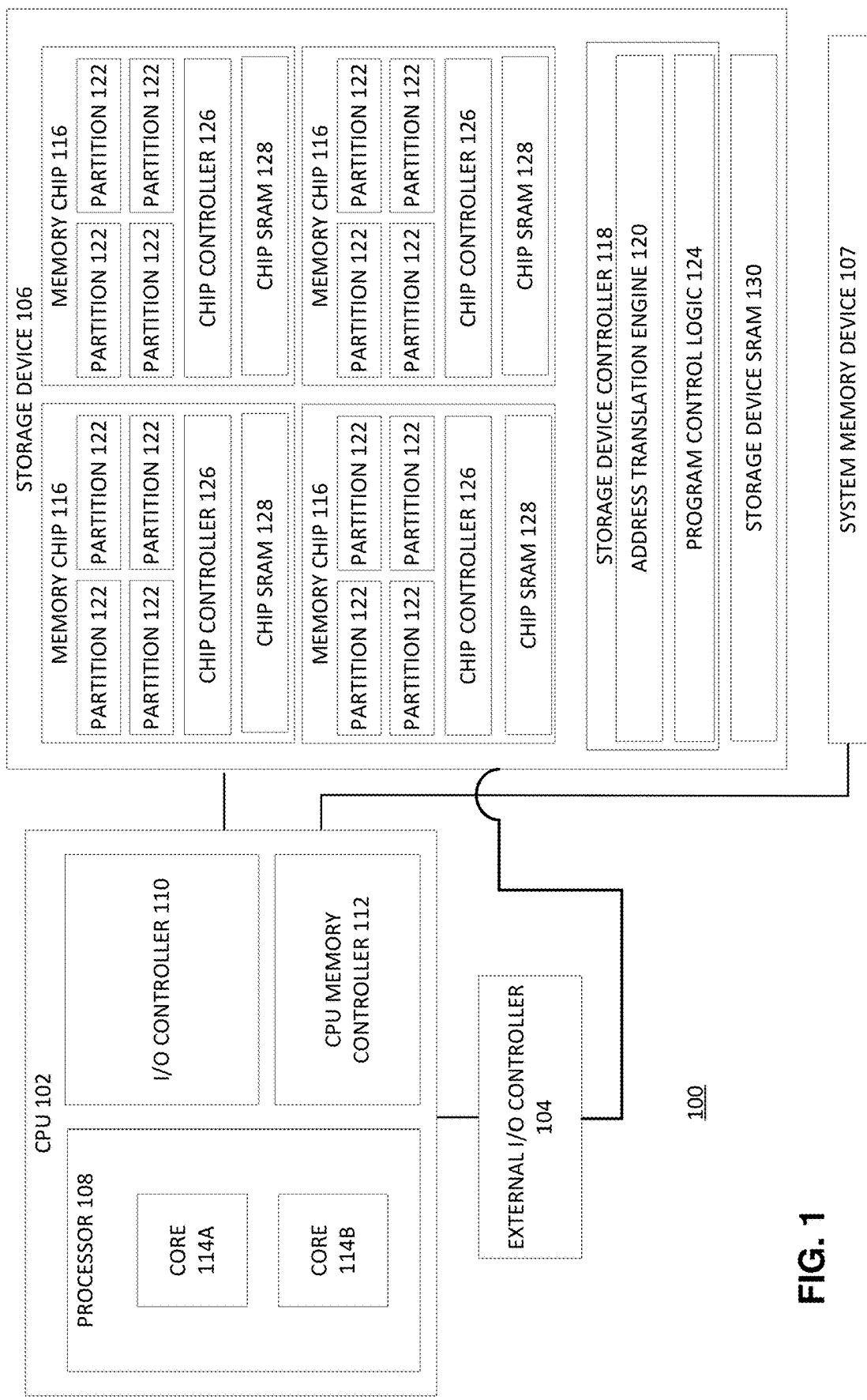
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition may include a 3D crosspoint memory array. In some embodiments, a 3D crosspoint memory array may comprise a transistor-less (i.e., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a DSP, a network processor, a handheld processor, an application processor, a co-processor, an SOC, or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that maintains its state even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory module may include non-volatile memory and/or volatile memory.

Non-volatile memory is a storage medium that does not require power to maintain the state of data stored by the medium. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Volatile memory is a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. The network and bitlines and wordlines together are part of a memory access circuit to access the logic states of the memory cells. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to the memory chips 116, and provide data associated with the requests to CPU 102 (e.g., via CPU memory controller 112 or I/O controller 110). Controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM 130 and chip SRAM 128 each are adapted to execute internal firmware or software of the storage device 106 and memory chip 116 respectively. For example, the logic to be implemented by program control logic 124, upon the issuance of a command, for example from the host or CPU 102 to execute the logic, may be moved from a memory storing the logic to SRAM 130 (such as a NVM—not shown) such that the logic may be executed by the storage device controller 118 which will have access to the logic instructions by way of the associated SRAM 128. Similarly, the logic to be implemented by the chip controller 126, upon the issuance of a command, for example from the host or CPU 102 to execute the logic, may be moved from a memory storage the logic to the associated SRAM 128 (such as a NVM—not shown) such that the logic may be executed by the associated chip controller 126 which will have access to the logic instructions by way of the associated SRAM 128.

Figure 2:
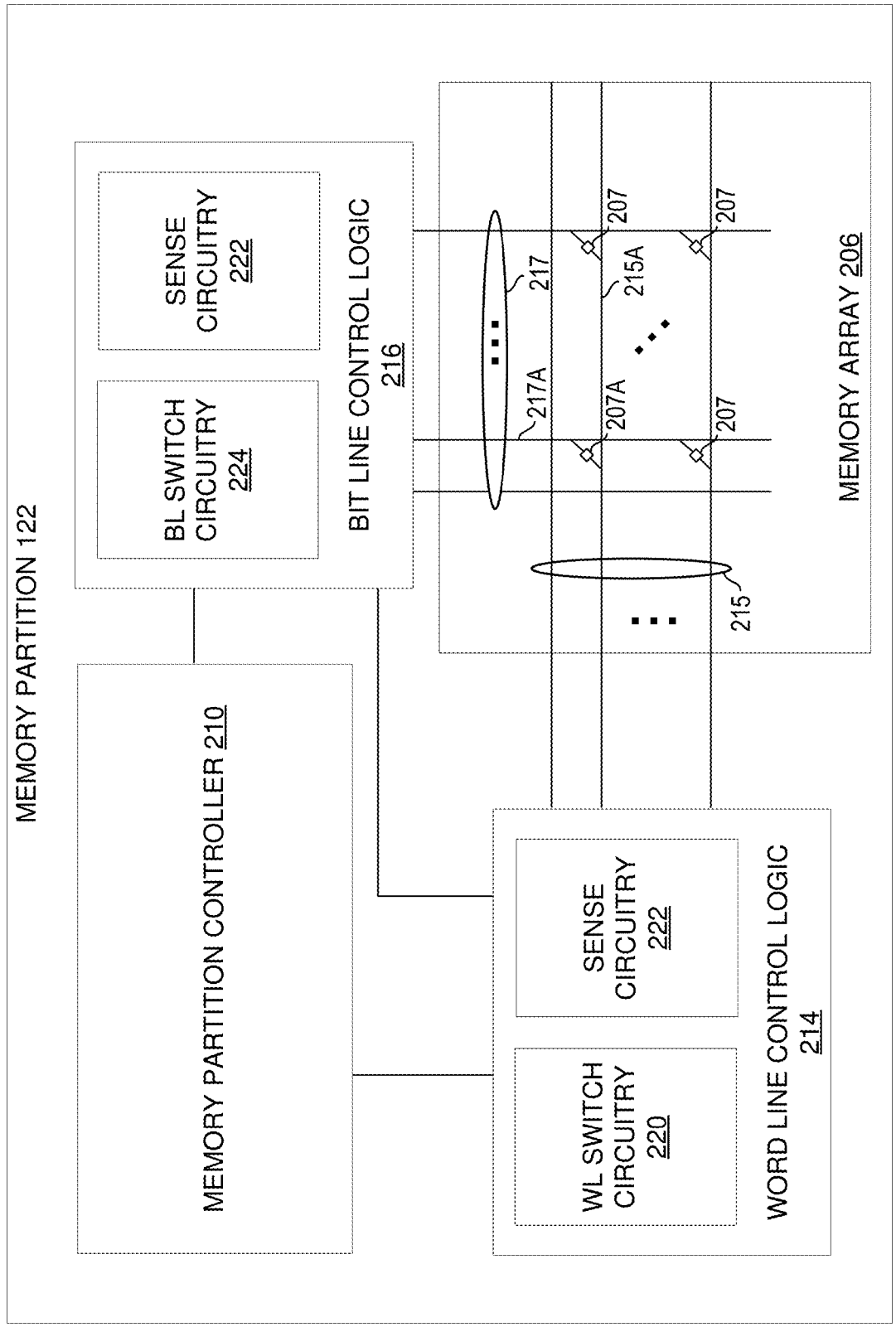
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, i.e., a select device coupled to the memory element. The select devices are configured to facilitate combining a plurality of memory elements into an array.

In some embodiments, a 3D crosspoint memory array 206 may comprise a transistor-less (i.e., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (i.e., crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION and/or MICRON TECHNOLOGY, INC.

During a programming operation (i.e., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage (a demarcation read voltage (VDM)) across the memory element is configured to be greater than a maximum set voltage and less than a minimum reset voltage for the memory element.

In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still see approximately ½ of VDM, with only cell 207A seeing the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122

(e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc. Memory array 206 may be configured to store binary data and may be written to (i.e., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to WL select bias voltage to select the respective WL 215A. For example, switch circuitry 220 may include a plurality of transistors.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select one or more target memory cells, e.g., memory cell 207A, for a read operation by coupling WL 215A to WL select bias voltage and BL 217A to BL select bias voltage. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a wordline (WL) load connected to a WL electrode or gate, and a bitline (BL) load connected to a bitline electrode or gate. When a particular wordline and bitline are selected in the array, a different between WL load or WL voltage and the BL voltage correspond to a read VDM. VDM may induce a current in the memory cell 207A, $I_{cell}$. A comparator such as a sense circuitry may compare $I_{cell}$ with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense circuitry/comparator may be indicative of a state of the target memory cell. A latch may be coupled to the output of the comparator to store the output of the read operation. In some embodiments, leakage components of the current can be mitigated by respectively selecting a bias for all other unselected wordlines and bitlines that reduces or minimizes leakage. Capacitive components of the current can be mitigated by allowing sufficient time for the capacitive components to dissipate.

For each matrix of arrays, there may be a sense circuitry provided. Each partition 122 may have 128 such matrices, hence 128 sense amplifiers. Each partition may be read from one read operation.

Figure 3:
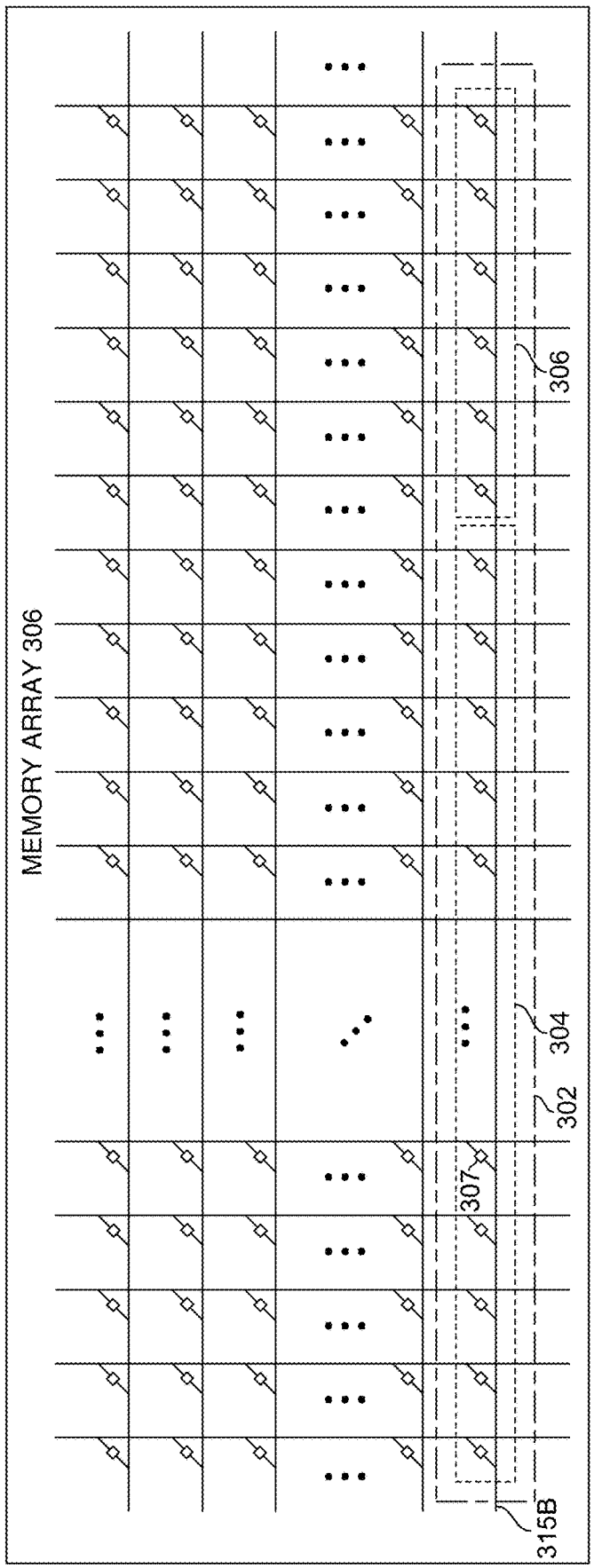
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers 210.

Figure 4:
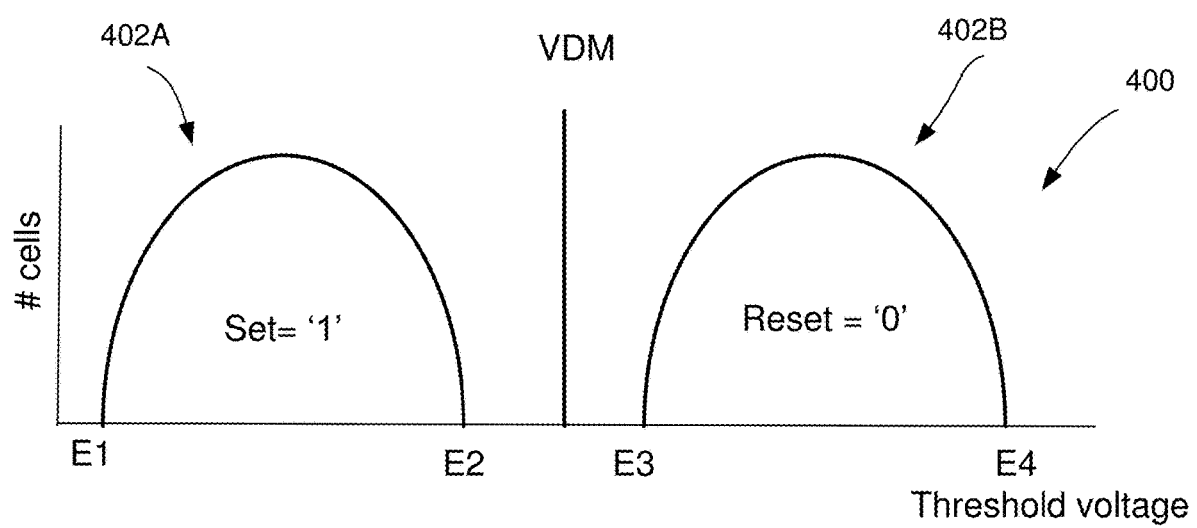
FIG. 4 is a graph depicting memory cell threshold voltage distributions and demarcation voltages in accordance with certain embodiments for a single level cell memory.

FIG. 4 illustrates a plot or graph 400 depicting memory cell threshold voltage statistical distributions 402A for set cells (storing a bit 1), and 402B for reset cells (storing a bit 0) (these are meant to represent bell curves for example), and a read voltage VDM.

In FIG. 4, the horizontal axis depicts threshold voltages of memory cells of a single level cell array and the vertical axis depicts bit counts (i.e., number of memory cells). Thus, each point of a distribution 402A/402B represents a number of cells having a particular threshold voltage. The graph 400 assumes that half of the bits of the array are in a set state (i.e., have a threshold voltage lower than the corresponding VDM) and half of the bits are in a reset state (i.e., have a threshold voltage higher than the corresponding VDM). Distributions 402A and 402B represents a baseline distribution that may correspond to a threshold voltage distribution at a particular point in time.

In a read operation, a target memory cell, such as cell 207A, is selected via the application of a first bias voltage to the WL 215A and a second bias voltage to the BL 217A that cross at the target memory cell for a time interval. A resulting differential bias voltage (a demarcation read voltage (VDM)) across the memory element is configured to be greater than a maximum set voltage E2 and less than a minimum reset voltage E3 for the memory element.

In response to application of the VDM, the target cell may or may not snap back, depending on whether the target cell is in the crystalline state (set) or the amorphous state (reset), as suggested in FIG. 4. If the target cell is in a set state, application of the VDM would cause the set cell to snap back, in which case the target cell would be read as a logic one, and if the target cell is in a reset state, application of the VDM, ideally, would not cause the reset cell to snap back, in which case the target cell would be read as a logic zero.

Sense circuitry, coupled to the memory cell, is configured to detect the presence or absence of snap back in a sensing time interval. The presence of snap back may then be interpreted as a logic one and the absence of snap back as a logic zero as noted above.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell as shown in FIG. 4, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM and be a negative regulated node.

Figure 5:
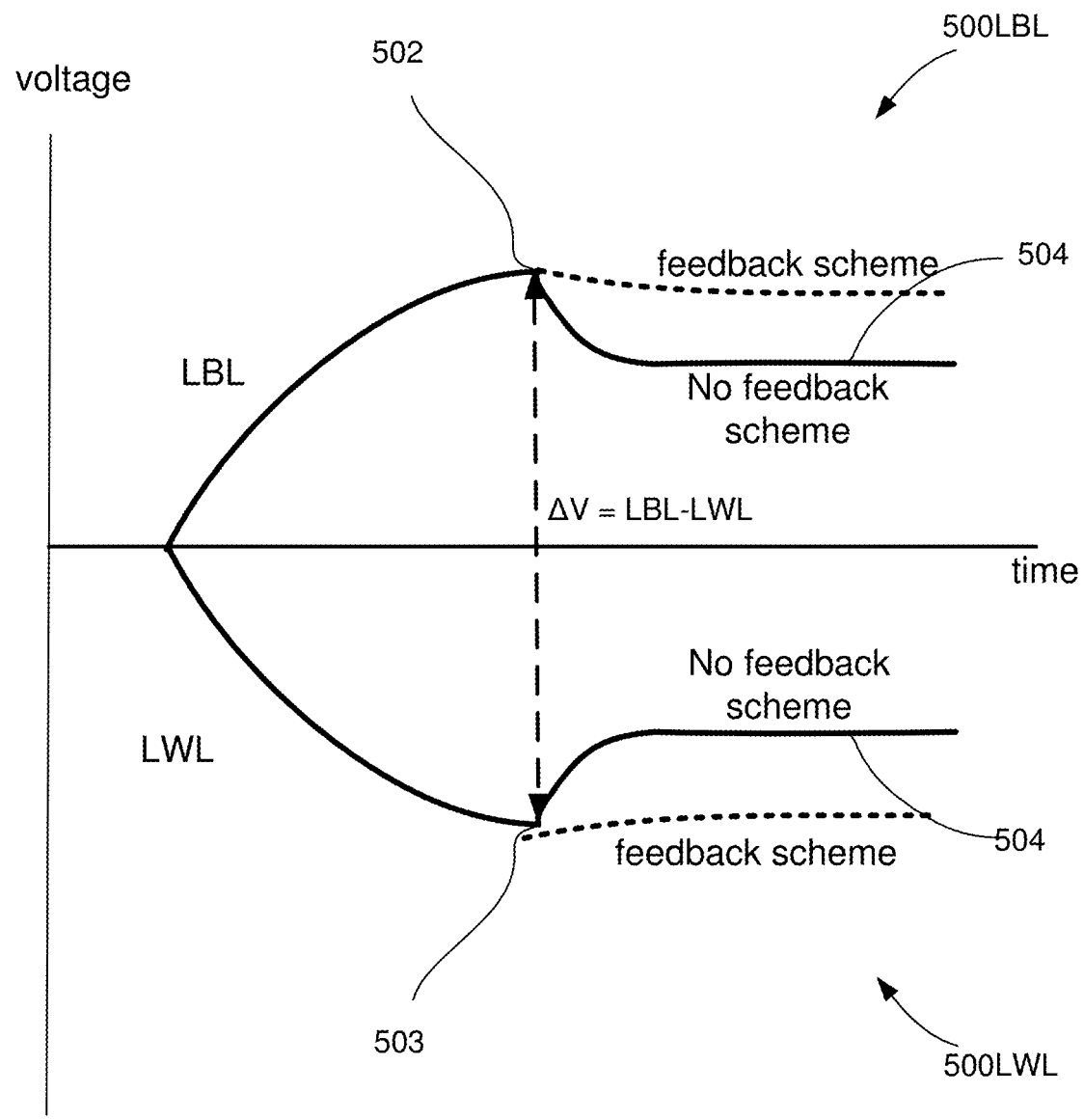
FIG. 5 is a graph showing the voltage at a bitline side node of a memory cell and the voltage at a wordline side node of the memory cell plotted against time during a read operation.

Referring now to FIG. 5, a graph 500 shows the voltage at LBL (bitline side node of a memory cell) and the voltage at LWL (wordline side node of the memory cell) both undergoing a change (a reduction for the LBL voltage, and an increase in LWL voltage in the form of a decrease in its absolute, because the voltage at the LWL node is negative) during a read operation so as to snap a set cell but avoid snapping a reset cell. LBL may be set to ramp to a level 502 at the threshold, and LWL to ramp down to a level 503 at the threshold, corresponding to a voltage differential VDM between E2 and E3 (see FIG. 4) across the memory cell to snap the set cell.

As suggested in FIG. 5, when a memory cell is thresholded (subjected to a threshold voltage) for reading purposes, a problem may arise in that the voltage across the cell (the voltage difference ΔV between LBL and LWL) may collapse, as suggested by the voltage at LBL decreasing and the voltage at LWL increasing in the "no feedback scheme" 504 after thresholding. ΔV correlates with VDM, which would therefore also decrease (what we will call the "VDM collapse issue"). However, if VDM collapses, the necessary read current $I_{Read}$ across the memory cell would no longer be sustainable, resulting in possible read errors.

Although the graphs of FIG. 4 and FIG. 5 have been shown in the context of a single level cell (SLC) memory, the same issues as outlined herein with respect to FIGS. 4-5 are equally applicable in the cases of multi-level cell (MLC) memories, triple level cell (TLC) memories, quad level cell (QLC) memories, penta level cell (PLC) memories, or any other memories involving memory cell array. In particular, the VDM collapse issue may affect any memory cell that may be programmed according to a particular encoding scheme and readable using the application of a voltage such as VDM.

Figure 6:
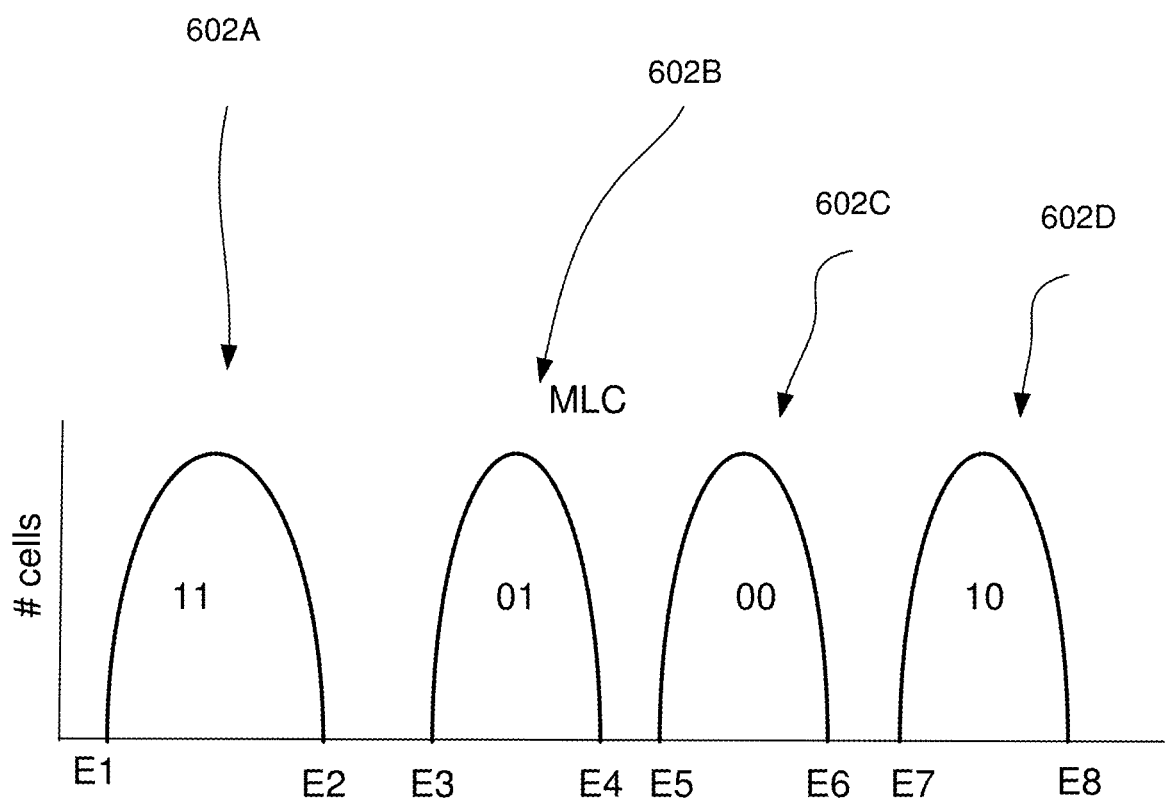
FIG. 6 is a figure similar to FIG. 4, but for a multi-level cell memory.

A memory cell can be programmed according to one or more encoding schemes such as SLC (single level cell), MLC (multi-level cell) as shown in FIG. 6, TLC (triple level cell), QLC (quad level cell), or other encoding scheme. In a SLC memory, each memory cell has two voltage levels corresponding to two states (0, 1) to represent one bit. In a MLC, TLC and QLC memory, each memory cell stores two or more bits. Each cell in a MLC memory uses four voltage levels corresponding to four states (00, 01, 10, 11) to represent 2 bits of binary data. Each cell in a TLC memory uses eight voltage levels corresponding to eight states (000 to 111) to represent 3 bits of binary data. Each cell in a QLC memory uses sixteen voltage levels corresponding to sixteen states (0000 to 1111) to represent 4 bits of binary data. In one example, each cell's threshold voltage is indicative of the data that is stored in the cell.

By way of example, FIG. 6 shows a graph similar to FIG. 4 for a MLC memory, including distributions 602A for cells with state 11, 602B for cells with state 01, 602C for cells with state 00, and 602D for cells with state 10. Here, the VDM between E2 and E3 may for example cause the same VDM collapse issues as those outlined with respect to the SLC example of FIG. 4.

Although FIGS. 7A-14 to be described below for the most part describe a reference circuit coupled to a BL side of a memory cell, it could in the alternative be provided the WL nodes. Thus, in either case, the concept in FIGS. 8-14 is to apply the circuitry on the side of the memory cell to which the sensing circuitry is connected. To the extent that FIGS. 7A-14 describe a reference circuit and feedback circuit at the BL side, biases denoted with "blvdm" are used in the description below. However, it is to be understood that, where the reference circuit and feedback circuit are provided at the WL side, these biases would have been denoted with "wlvdm" instead. Thus, when a designation of "$V_{vdm}$" or "$I_{vdm}$" is used to refer to, respectively, voltage or current, it is meant to refer to, respectively, "$V_{blvdm}$" and "$I_{blvdm}$" when the reference circuit and feedback circuit are on the BL side, and, respectively, to "$V_{wlvdm}$" and "$I_{wlvdm}$" when the reference circuit and feedback circuit are on the WL side.

Figures 7A, 7B:
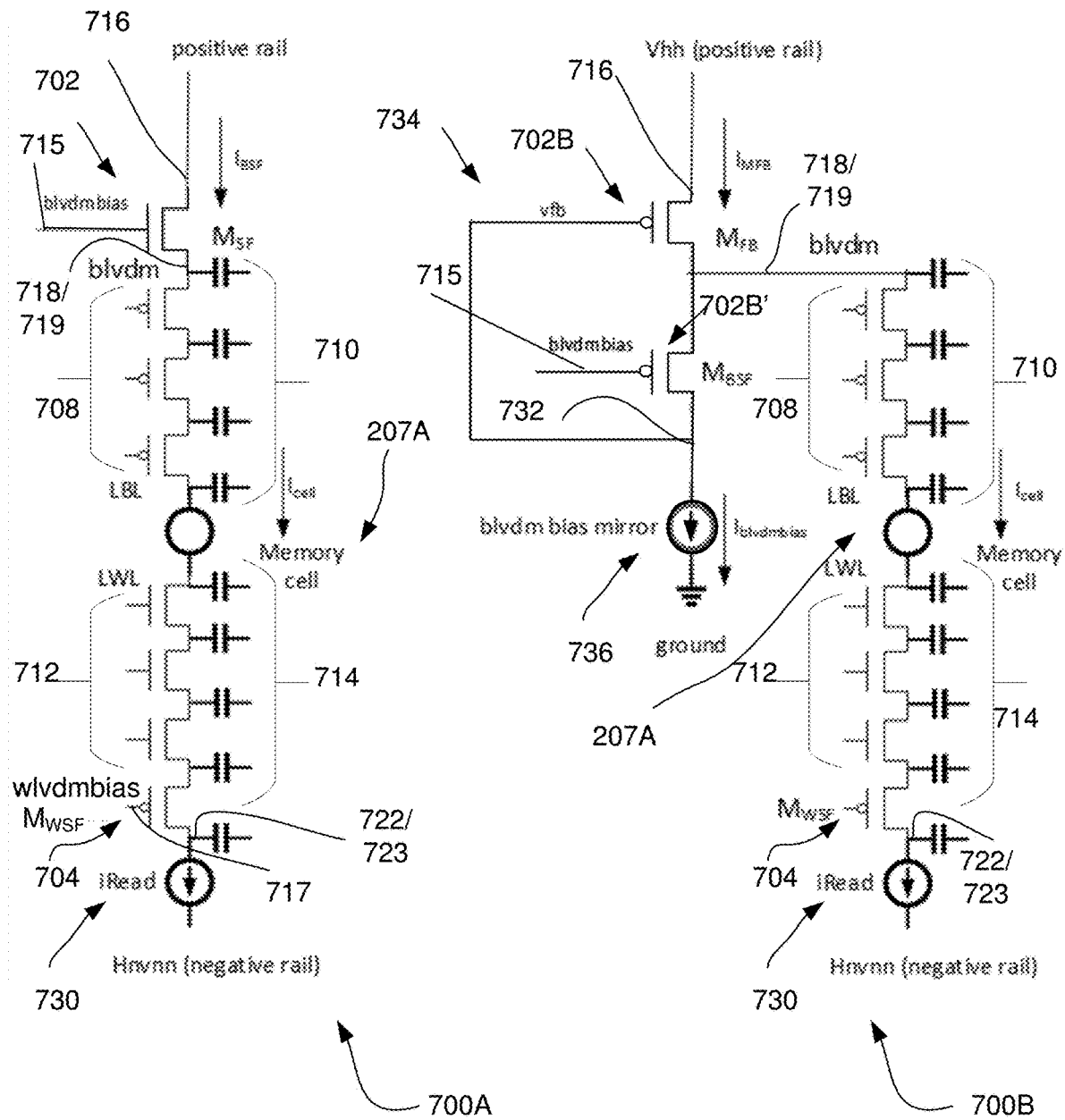
FIG. 7A shows a memory circuitry corresponding to a regular scheme for reading a memory cell.
FIG. 7B shows a memory circuitry corresponding to an active demarcation voltage (VDM) source follower (SF) scheme designed to mitigate a VDM collapse issue.

Reference is now made to FIGS. 7A and 7B, which depict memory circuitries 700A and 700B of a memory device, such as memory partition 122 of FIG. 1. While memory circuitry 700A of FIG. 7A shows a regular scheme for reading a thresholded cell, FIG. 7B shows an active VDM source follower (SF) scheme designed to mitigate the VDM collapse issue and to therefore increase current delivery post thresholding in a memory cell, such as in a 3DXP memory cell. The feedback architecture such as the one shown in FIG. 7B and to be described below uses a feedback mechanism to reduce the voltage drop. This architecture however poses new challenges to the design a sensing scheme. Embodiments, as will be described by way of example with reference to FIG. 7B Referring now in particular to FIGS. 7A and 7B, memory circuitries 700A and 700B depict circuit elements including circuit nodes coupled to a memory cell 207A, corresponding for example to any memory cell 207 of memory array 206 as shown for example in FIGS. 2 and 3 described above.

Referring first to FIG. 7A, the example memory circuitry 700A includes BL metal oxide semiconductor field effect transistor (MOSFET) or $M_{SF}$ 702, shown in the figure as a n-type MOSFET or NMOS transistor, and a WL MOSFET or $M_{WSF}$ 704 shown in the figure as a p-type MOSFET or PMOS transistor. BL NMOS 702 includes a BL gate at blvdmbias 715, and two BL NMOS terminals 716 and 718, while WL 704 includes a WL gate at wlvdmbias 717, and two WL PMOS terminals 720 and 722. VDM is the voltage across the memory cell 207A, and is defined as the difference between the voltage blvdm $V_{blvdm}$ at the BL NMOS terminal 718, and the voltage wlvdm at the WL PMOS terminal 720. Although a NMOS transistor 702 is shown for the BL side and a PMOS transistor 704 is shown for the WL side in FIG. 7A, embodiments are not so limited and include within their scope any circuitry to induce a VDM between two nodes, a BL node 719 configured to be at a first voltage blvdm $V_{blvdm}$, which in the shown example corresponds to BL terminal 718, and a WL node 721 configured to be at second voltage wlvdm, which in the shown example corresponds to WL node 721. Because the voltage applied to BL gate 715 is to be positive and the voltage applied to WL gate 717 is to be negative, the value of VDM corresponds to an addition of the absolute values of the voltages at blvdm and wlvdm, which feature is suggested for example in FIG. 5, which shows the voltages at LBL and LWL (these respectively track the voltages blvdm and wlvdm). The memory cell 207A and its associated circuit elements are provided between the BL NMOS 702 and WL PMOS 704, and include a series of PMOS transistors 708 and associated capacitors 710 between the memory cell 207A and BL NMOS 702, and a series of PMOS transistors 712 and associated capacitors 714 as shown. The bitline side of the memory circuitry 700A is set at a positive rail, and the WL side at a negative rail (Hnvnn). A $I_{Read}$ current generation circuitry 730 is further provided between drain terminal 822 of $M_{WSF}$ 704 and the negative rail, where the $I_{Read}$ corresponds to the current $I_{cell}$ running through the memory cell and to the current $I_{BSF}$ running through NMOS $M_{SF}$ 702. Before thresholding, $I_{BSF}$, $I_{cell}$ and $I_{Read}$ are negligible, for example below 5 µs. After thresholding, for a read operation, $I_{BSF}$, $I_{cell}$ and $I_{Read}$ may be much larger, for example 10× larger.

Referring still to FIG. 7A, for a regular scheme or a no-feedback scheme as shown, where the voltage at the blvdm node 718 is dictated by the blvdmbias voltage at the BL gate 715 and the Vt (or threshold voltage) of $M_{SF}$ 702. However, if the LBL node voltage collapses, for example after thresholding as suggested in FIG. 5 described above, $V_{blvdm}$ at source 718 will also collapse, as LBL and $V_{blvdm}$ track one another. Where the voltage at blvdm $V_{blvdm}$ collapses, as noted above with respect to FIG. 5, the circuit would have difficulty supporting the necessary current, $I_{cell}$, through the cell 207A by virtue of Ohm's law.

FIG. 7B provides a replica reference voltage generation circuit architecture/active VDM structure that aims to solve the above VDM collapse issue noted with respect to FIGS. 6 and 7A above. The example memory circuitry 700B includes many of the same features of the memory circuitry 700A of FIG. 7A, labeled with the same reference numerals, and those features will therefore not be described below.

In FIG. 7B, the NMOS 702 of FIG. 7A has been replaced by a feedback circuit 734 which includes two PMOS transistors 702B and 702B' connected in series. Source terminal 716 of PMOS $M_{FB}$ 702B is connected to a positive rail, for example VHH, and drain terminal 718/719 is at $V_{blvdm}$ and connected to the source of the series of PMOS' 708 and to capacitors 710 as shown. The node 718/719 also serves as the source terminal of PMOS $M_{BSF}$ 702B'. $M_{BSF}$ 702B' has a drain 732 which serves as a feedback $V_{FB}$ voltage node into the gate of $M_{FB}$ 702B. The gate of $M_{BSF}$ is at the blvdmbias voltage 715. A blvdm bias mirror current generation circuitry 736 is also provided and connected to the drain 732 at one end thereof, and to ground at another end thereof. In the circuitry of FIG. 7B, current $I_{MFB}$ runs through terminal 716, and feeds both $I_{cell}$ on the one hand, and $I_{blvdmbias}$ on the other hand.

The feedback solution of FIG. 7B where blvdmbias applied to the gate of $M_{BSF}$ 702B' and the drain voltage $V_{FB}$ of $M_{BSF}$ supplies voltage to the gate of $M_{FB}$ 702B mitigates the VDM collapse issue noted with respect to FIG. 7A by counteracting the voltage collapse by virtue of the effect of the feedback circuit, and allows the circuit to support the current through cell 207A after thresholding in order to perform a read operation. Before thresholding, there is only negligible current, e.g. 2-4 μs running through cell 270A, and there is no control per se of the current through cell 207A by virtue of $I_{Read}$ circuitry 730. Post thresholding, $I_{cell}$ could go up to 30 or 35 μs by way of example, as controlled by $I_{Read}$ circuitry 730. The voltage blvdmbias (Vblvdmbias or simply blvdmbias) is controlled by way of a voltage regulator. After thresholding, supplying VHH, Hnvnn, blvdmbias, wlvdmbias (or Vwlvdmbias), $I_{Read}$ and $I_{blvdmbias}$ would ensure a lesser VDM collapse (as shown by way of example in FIG. 5) and therefore would support the current $I_{cell}$ through the memory cell in a sustainable manner. Controlling $I_{blvdmbias}$ control $I_{MFB}$, which in turn controls $I_{cell}$. Post threshold $I_{MFB}$ will be higher and will be supporting both the $I_{blvdmbias}$ and $I_{cell}$, and blvdmbias and $I_{blvdmbias}$, do not change post threshold.

In the regular scheme or no feedback scheme as shown in FIG. 7A, the voltage at the blvdm node 718/719 $V_{blvdm}$ is dictated by gate voltage blvdmbias and the threshold voltage Vt of device $M_{SF}$ 702. In the feedback architecture of FIG. 7B, the voltage at the blvdm node $V_{blvdm}$ is a function of $M_{BSF}$ gate voltage blvdmbias, Vt of $M_{BSF}$ and current of 'blvdm bias mirror' ($I_{blvdmbias}$) The drain voltage of $M_{BSF}$, $V_{FB}$, acts as a voltage feedback to the transistor $M_{FB}$ as noted above. $V_{DS}$ of $M_{FB}$=VHH−$V_{apblvdm}$. Current through $M_{FB}$ is dictated by memory cell current $I_{cell}$ and blvdm bias current $I_{blvdmbias}$. By applying Kirchoff s Current Law (KCL) at the blvdm node 718/719, we obtain Equation (1) below:

$$I_{MFB}=I_{cell}+I_{blvdmbias} \quad (Eq. 1)$$

The $M_{FB}$ gate voltage $V_{FB}$ is dictated by the feedback loop from drain 732 of $M_{BSF}$ by satisfying KCL at the blvdm node 718/719.

An advantage of the active feedback scheme as shown in FIG. 7B by way of example as compared with traditional no feedback source follower schemes as shown in FIG. 7A by way of example, is that the 'blvdm' node does not drop post thresholding of a set cell as shown in FIG. 5. In a no feedback SF case, by way of example, the voltage reduction for a thresholded cell may be about 200 mV, while with feedback the voltage drop may reduce to about ~10 mV. The above provides enhanced current delivery through the memory cell, as dictated by Ohm's law (I=V/R). Higher voltage means higher current which is important to keep the thresholded cell conducting during read algorithms. Cell conduction is important for sensing and for placement of cell threshold voltage post sense. An advantage provided by the feedback circuit improves read window and yield. Similarly, the SF scheme with feedback can be extended (although not shown here) to the WLVDM ($M_{WSF}$) side.

In a feedback scheme such as the one shown in FIG. 7B, $I_{blvdmbias}$ may always be the same regardless of whether a cell is a thresholded (snap/set scenario) or prethreshold (presnap/preset scenario), and is controlled by the blvdmbias current mirror circuitry 736. For a thresholded scenario, where for example $I_{MFB}$ is 35 μs, 10 μs may come from $I_{blvdmbias}$ (which may be fixed) and 25 μs may be attributed to $I_{cell}$. $I_{cell}$ will be controlled by the current mirror circuitry 736.

In the feedback scheme of FIG. 7B, the two PMOS $M_{FB}$ and $M_{BSF}$ create a nearly constant bias at blvdm (see for example FIG. 6, where the drop in the absolute value of the voltage post thresholding is not significant), for example in a snap or thresholded state of the cell. Although the feedback scheme mitigates the VDM collapse issue as noted above, one challenge it creates is that since the voltage at blvdm is now not collapsing, the voltage difference between a thresholded cell and non-thresholded cell can no longer be used reliably for sensing the state of the cell. Let us refer to this issue as the feedback scheme sensing issue.

Some embodiments aim to mitigate the feedback scheme sensing issue by providing an integrated circuit, method, system and storage medium. The integrated circuit of a the memory module includes a memory array including memory cells to store binary logical states. A memory access circuit is coupled to each of the memory cells and includes: a feedback circuit coupled to one of a bitline node (BL) or a wordline node (WL) of each of the memory cells and configured to, in a thresholded state of said each of the memory cells, counteract a decrease in an absolute value of a voltage $V_{vdm}$ at said one of the BL or WL. The feedback circuit is to generate a feedback voltage $V_{FB}$ therein. A reference circuit is configured to generate one of a reference voltage $V_{REF}$ or a mirror current $I_{MFBmirror}$ therein, and configured such that either the $V_{REF}$ is to track a feedback voltage of the feedback circuit (for a differential voltage sensing scheme according to a first embodiment, an example of which is provided in the context of FIG. 8) or the $I_{MFBmirror}$ is to track a current $I_{cell}$ through said each of the memory cells (a differential current sensing scheme according to a second embodiment, an example of which is provided in the context of FIG. 12). The memory access circuit is to be coupled to sense circuitry to provide one of values for both $V_{FB}$ and $V_{REF}$ on the one hand (for a differential voltage sensing scheme) or for an output voltage $V_{apsout}$ corresponding to $I_{MFBmirror}$ on the other hand (a differential current sensing scheme) to the sense circuitry to cause the sense circuitry to determine a logic state of said each of the memory cells.

According to a first embodiment, as will be explained further below with respect to the example circuitry of FIG. 8, instead of using a drop in the voltage at blvdm for sensing a state of the cell as would have been done in a non-feedback scheme, such as the one in FIG. 7A, the $V_{FB}$ at drain 732 of $M_{BSF}$ 702B' or at the gate of $M_{FB}$ 702B may be used to sense the state of the cell. In the feedback scheme, unlike blvdm, $V_{FB}$ tends to vary appreciably between a thresholded state cell and non thresholded state of the cell. The gate to source voltage $V_{GS}$ that supports the current $I_{MFB}$ may be given by $V_{FB}$−VHH, which is the $V_{GS}$ of $M_{FB}$. Because of the change in $V_{FB}$ between a thresholded state and a non-thresholded state, $V_{FB}$ may, according to an embodiment, be used to sense a logic state of a memory cell.

Figure 8:
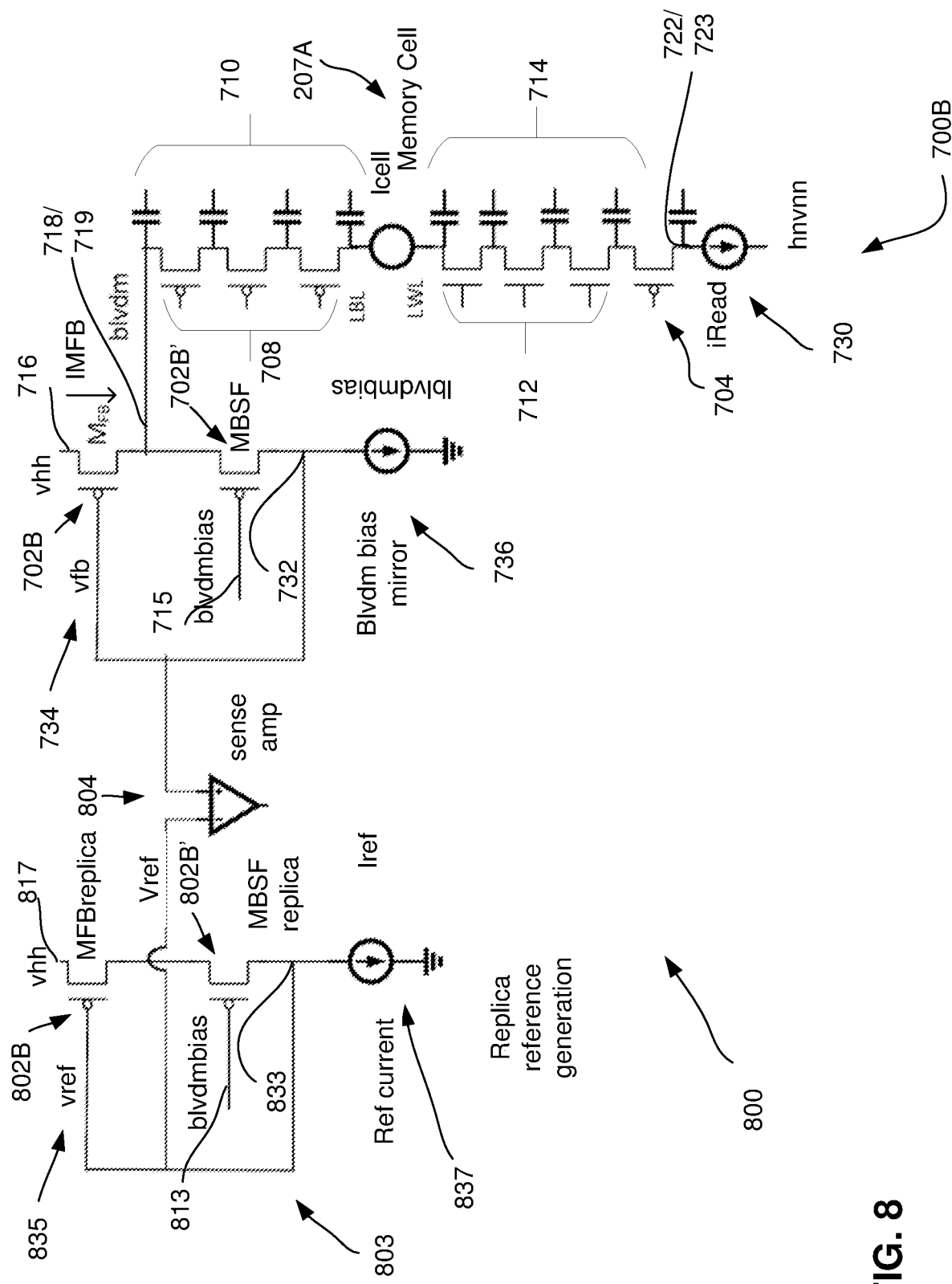
FIG. 8 shows a memory circuitry to provide a voltage sensing of a memory cell in the VDM SF scheme of FIG. 7B according to a first embodiment.

Referring now in particular to FIG. 8, an example memory circuitry 800 according to the first embodiment is shown, where the memory circuitry 700B of FIG. 7B is provided with a replica reference circuit 835 including a reference generation circuit 803 and a sense circuitry 804. In the embodiment of FIG. 8, the replica reference generation circuit 803 may include a replica of the feedback circuit 734, including two PMOS transistors 802B and 802B' connected in series, with $M_{FBreplica}$ 802B being a replica of $M_{FB}$ 702B, and $M_{BSFreplica}$ 802B' being a replica of $M_{BSF}$ 702B'. Source terminal 817 of PMOS $M_{FBreplica}$ 802B is connected to a positive rail, for example VHH, similar to source terminal 716 of $M_{FB}$ 702B. $M_{BSFreplica}$ 802B' has a drain 833 which serves as a feedback node to supply a $V_{REF}$ voltage into the gate of $M_{FB}$ 702B. A coupling of the replica reference generation circuit 803 to the feedback memory circuitry 700B is by way of sense circuitry 804, a function of which will be explained further below. The gate 813 of $M_{BSFreplica}$ is at the blvdmbias voltage $V_{blvdmbias}$. A reference mirror current generation circuitry 837 is also provided and connected to the drain 833 at one end thereof, and to ground at another end thereof. The first embodiment provides for the application of a reference current $I_{REF}$ to the path through PMOS transistors 802B and 802B'. In the meantime, similar to the feedback circuit 734, VHH is shown as having been applied at source terminal 817, and $V_{blvdmbias}$ at gate 813. Because circuit 835 is a replica of circuit 734, and further by virtue of the applied voltages VHH, $V_{blvdmbias}$ being the same for both circuitries 834 and 835, any variations in $V_{REF}$ in circuit 835 are expected to track variations in $V_{FB}$ in circuit 734, not only by virtue of whether the cell is thresholded or not thresholded, but also any further variations by virtue of process, voltage and/or temperature (PVT) variations possible in the active VDM scheme of circuit 700B. Absolute voltage value at the $V_{FB}$ node can vary measurably depending on PVT variations, and the replica reference current in circuit 834 can generate $V_{REF}$ by tracking those PVT variations, which is an advantage of the first embodiment of FIG. 8. Although $V_{REF}$ may exhibit some offset in variations as compared with $V_{FB}$, which offset may not be readily trackable, if the sense signal is higher than the noise or offset then we can transform the analog voltage differential from the sense circuitry 804 to the correct digital output to indicate the logic state of the memory cell 207A.

In particular, in the shown scheme of circuit 835, reference mirror current generation circuitry 837 may be used to apply a reference current $I_{REF}$ to the path through transistors $M_{FBReplica}$ 803B and $M_{BSFreplica}$ 803B', generating $V_{REF}$ at node 733 as a result. $V_{REF}$, as noted above, will track any variations in $V_{FB}$ in circuit 734, including PVT variations. Sense circuitry 804 receives as inputs $V_{REF}$ and $V_{FB}$, and compares the two, in this way providing a differential voltage sensing scheme employed with the reference scheme of circuit 700B in order to create a sensing scheme that is reliable for sensing a logic state of the memory cell, and stable by virtue of not being susceptible to PVT variations.

In a particular embodiment, the sense circuitry 804 may include a first input connected to $V_{REF}$ and a second input connected to $V_{FB}$ as shown in FIG. 8. A comparator such as a sense circuitry 804, for example a sense amplifier, may compare $V_{REF}$ and $V_{FB}$ together in order to read a logic state one or logic state zero depending on whether the memory cell is a set cell or a reset cell.

Figure 9:
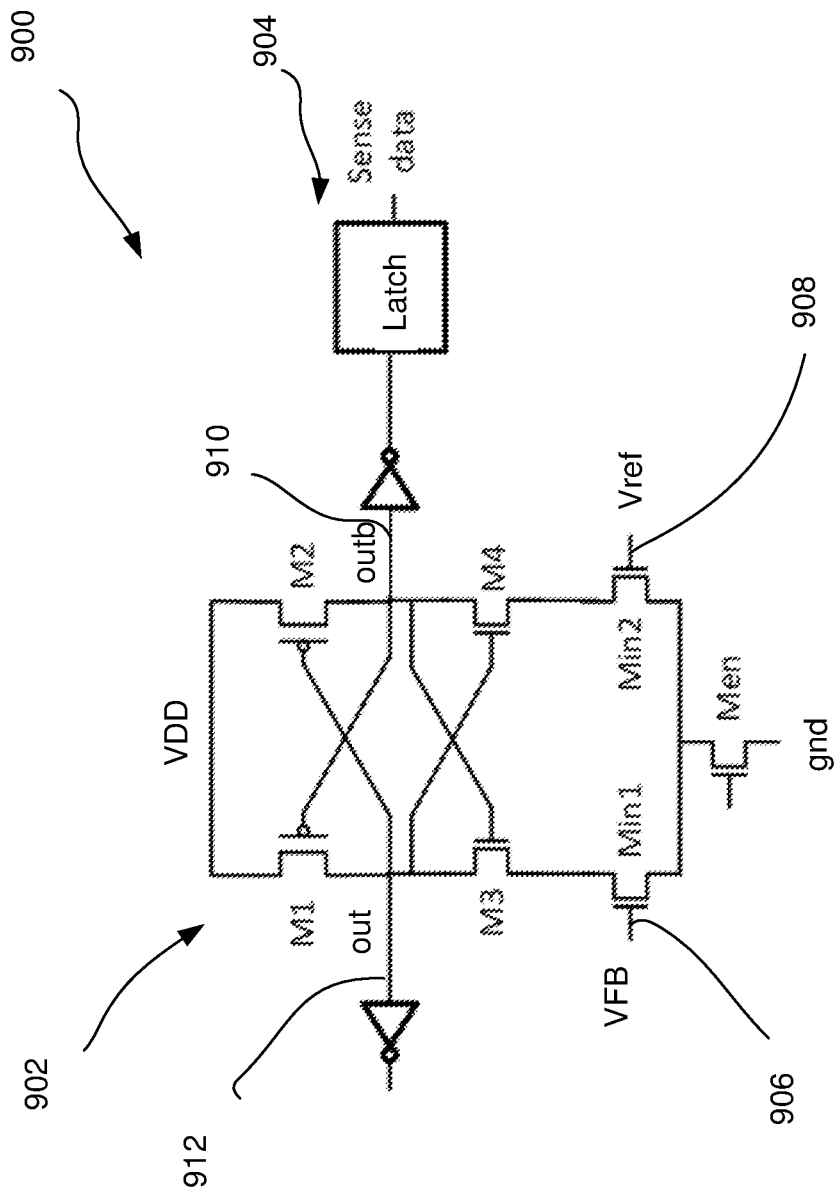
FIG. 9 shows a sensing architecture to be used in the memory circuitry of FIG. 8.

Reference is now made to a FIG. 9, which shows a sensing architecture 900 including a sense amplifier 903 and a latch arrangement 905 coupled thereto. Sense amplifier 903 may for example be used as part of the sense circuitry 804 of FIG. 8. A differential input signal at $V_{FB}$ and $V_{REF}$ fed into the inputs 906 and 908 of sense amplifier 903 may be converted to digital signal (logic '1' or '0') and stored in the data latch 905 as sense data. When a reset cell is read, $V_{FB} > V_{REF}$ and it would pull down the 'out' node 912 faster than the 'outb' node 910 towards ground. MOSFETs M1, M2, M3 & M4 are cross-coupled inverter pairs. When the 'out' node 912 is settled to ground or logic '0,' then 'outb' is settled to 'VDD' or logic '1' due to positive feedback loop present at cross coupled inverters. The signal at 'outb' 910 is inverted to logic '0' and stored in latch. The output of the sense amplifier 903 can be taken from either the 'out' node or the 'outb' node. When we read a 'set' cell, the opposite happens, that is, the sense data corresponds to a logic '1'. The latch 903 is shown coupled to the output of the comparator or sense amplifier 903 to store the output of the read operation. In some embodiments, leakage components of the current can be mitigated by respectively selecting a bias for all other unselected wordlines and bitlines that reduces or minimizes leakage. Capacitive components of the current can be mitigated by allowing sufficient time for the capacitive components to dissipate.

According to some embodiments, there may be a sense circuitry similar to sense circuitry 804 or sense amplifier 903 provided for each matrix of arrays. Referring back to FIG. 1 for example, each partition 122 may have 128 such matrices, hence 128 sense amplifiers. Each partition may be read from one read operation.

According to one embodiment, the replica reference generation circuit 835 of the first embodiment as shown by way of example in FIG. 8 may be associated with a dedicated sense circuitry, or it can be shared by multiple sense circuitries (for example 128 sense circuitries, or multiples of 128 sense circuitries).

Figure 10:
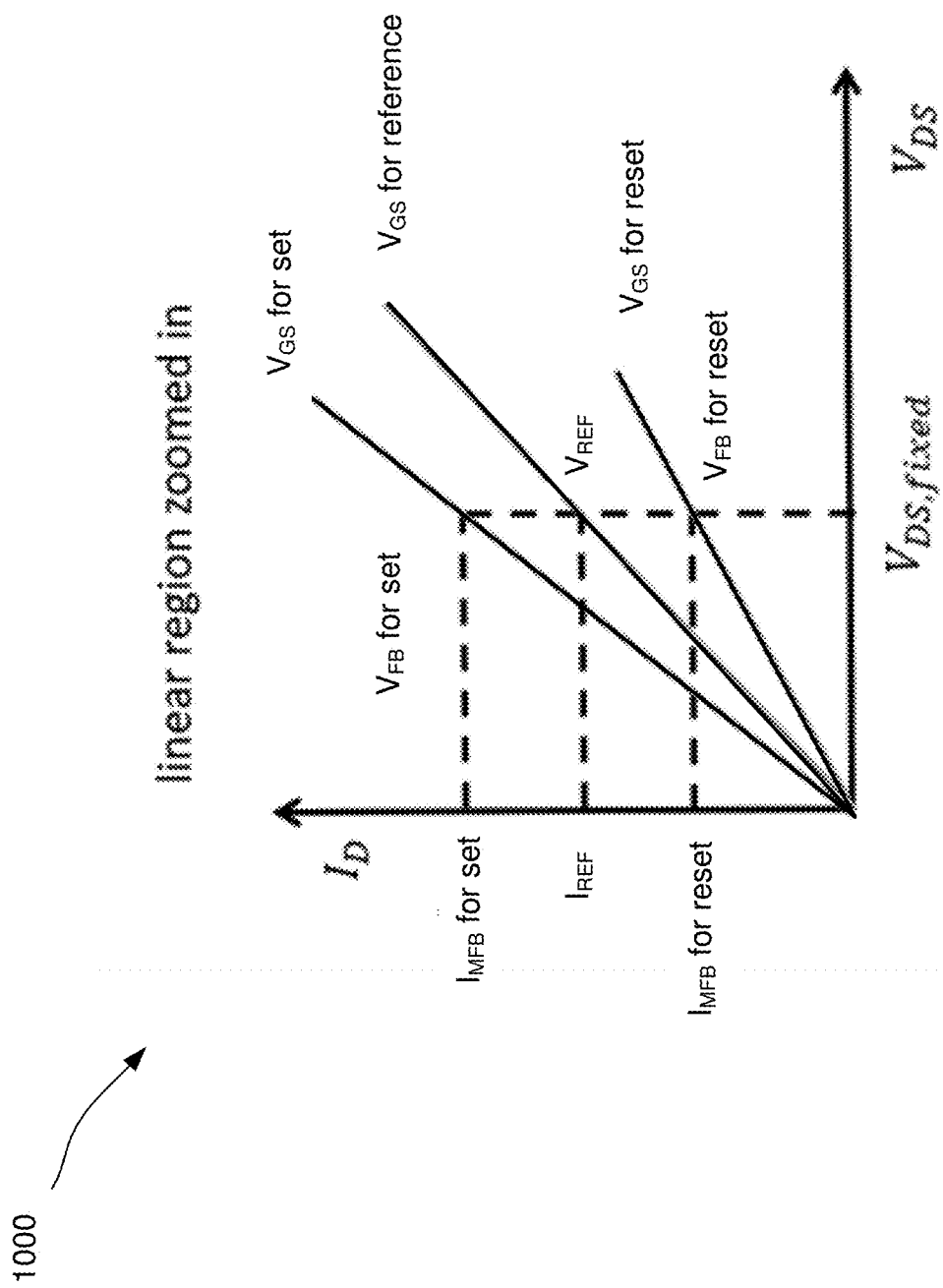
FIG. 10 shows an example graph plotting a current $I_{MFB}$ flowing through a transistor $M_{FB}$ of a feedback circuit of FIG. 8 versus $V_{DS}$ for $M_{FB}$.

FIG. 10 shows an example graph 1000 plotting current $I_{MFB}$ versus $V_{DS}$ for $M_{FB}$. If $M_{FB}$ is in linear operating point, then the current equation corresponding to $M_{FB}$ is yielded by Equation (2):

$$I_{DS} = \mu C_{ox} \frac{W}{L}\left[(V_{GS} - V_t)V_{DS} - \frac{V_{DS}^2}{2}\right] \quad \text{Eq. (2)}$$

or, $I_{DS} \propto |V_{GS}|$ where $I_{DS}$ corresponds to the current from the source to the drain of the $M_{FB}$, W/L corresponds to known geometric features of a transistor including W and L representing, respectively, the width and the length of the channel under the gate, and $\mu C_{ox}$ corresponds to the diffusion constant of the transistor base multiplied by the capacitance of the gate per unit area (the gate could be an oxide or not, according to embodiments), $V_{DS}$ corresponds to the voltage difference between the source and the drain of $M_{FB}$, $V_{GS}$ corresponds to the voltage differential between the gate and the source of the $M_{FB}$, Vt corresponds to the threshold voltage. Equation 2 among other things shows that $I_{DS}$ is proportional to $V_{GS}$ as shown by the linear graph of FIG. 10. FIG. 10 among other things shows that, for a same $V_{DS}$, $I_{MFB}$ would need to be higher for a set cell as compared with a reset cell. Each $I_{DS}$, and thus each $I_{REF}$ through node 733, will create or generate a different $V_{GS}$ or $V_{REF}$.

Referring still to FIG. 10, and referring back in addition to Equation 1 above, a read operation may include reading a SLC set cell using an $I_{MFB}$ at set, such as an $I_{MFB}$=35 µA, and a SLC reset cell using an $I_{MFB}$ at reset, such as $I_{MFB}$=12 According to one embodiment, the reference current $I_{REF}$ to be generated by reference current generation circuit 737 may be set to a value in between the 'set $I_{MFB}$' value, or thresholded $I_{MFB}$ value ($I_{MFB}$ when the cell has been thresholded and a larger current is flowing through the cell, or $I_{MFBset}$), and the 'reset $I_{MFB}$' or non-thresholded $I_{MFB}$ ($I_{MFB}$ when the cell has not been thresholded and only a leakage current is flowing through the cell, or $I_{MFBreset}$). For example, $I_{REF}$ may be selected to be about halfway between $I_{MFBset}$ and $I_{MFBreset}$. In the above example, we can set up $I_{REF}$=24 µA. This latter example is shown in FIG. 10. Setting $I_{REF}$ as noted above will generate or cause a $V_{REF}$ which will be different from $V_{FBset}$ and $V_{FBreset}$, but which, by virtue of the replica reference circuit 835, will track any variations in the voltage response of $M_{FB}$, such as variations brought about by way of PVT. When we have these distinctive voltages for different cell states, then we can design a differential voltage sense circuitry to convert the analog voltage signal to a logic '1' or '0' output signal.

Simulation Result for Voltage Sensing

Figure 11:
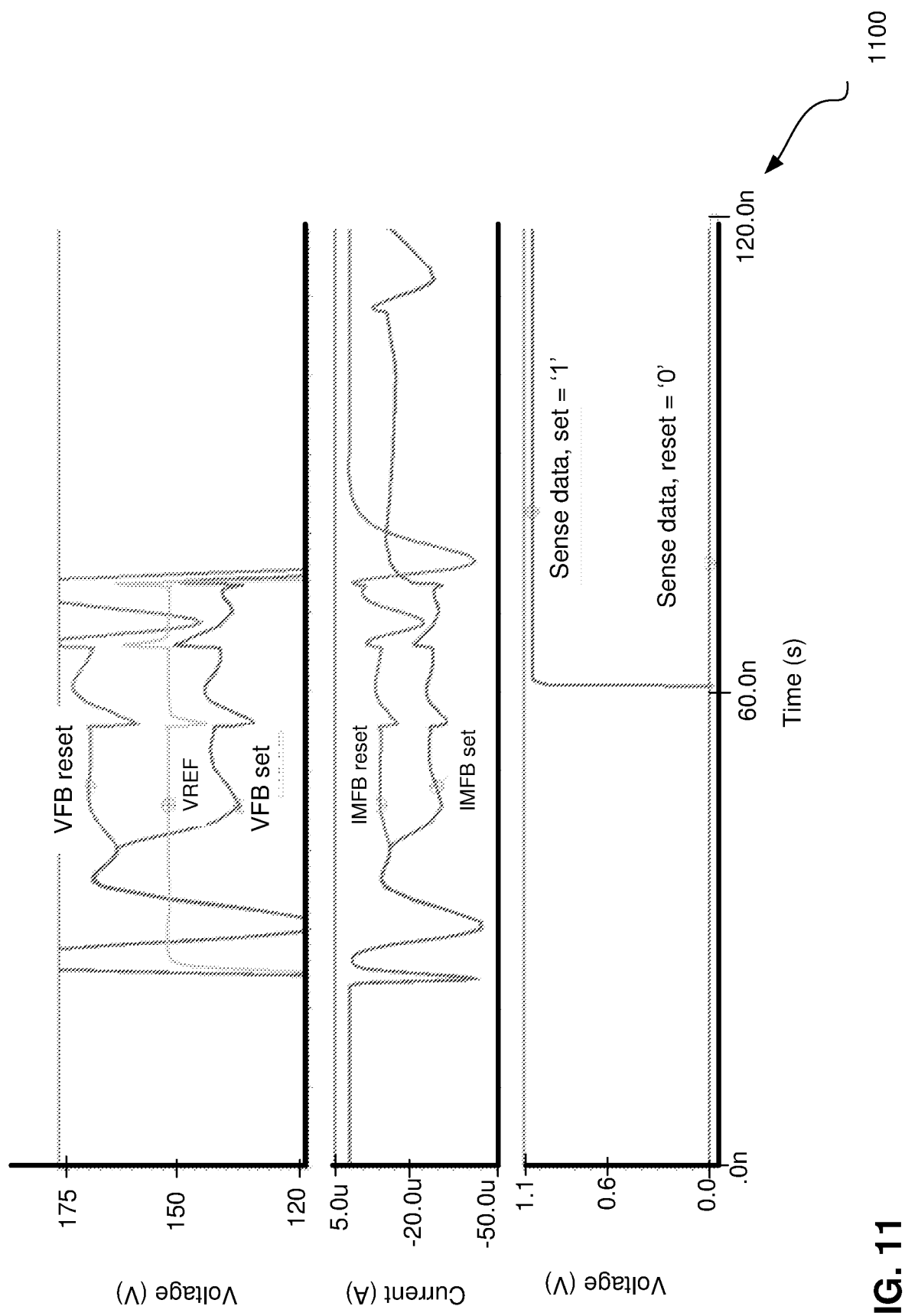
FIG. 11 shows graphs corresponding to transient simulation results for voltage sensing according to the first embodiment as shown in FIG. 8.

Reference is now made to FIG. 11, which shows graphs 1100 corresponding to transient simulation results for voltage sensing. The top section of FIG. 11 shows transient simulation results of the active VDM SF system such as the one shown in FIG. 8. There is a voltage delta between '$V_{FBreset}$' & '$V_{FBset}$' voltages and $V_{REF}$ may be placed in between those voltages according to the first embodiment, as suggested for example in FIG. 9. FIG. 11 at the top thus shows the behavior of an exemplary $V_{FB}$ in reading a set cell ($V_{FBset}$) and reset cell ($V_{FBreset}$). In this specific example, $I_{SET}>I_{RESET}$, $|V_{GSset}|>V_{GS}$ reset|, and $V_{FB}$ set<$V_{FB}$ reset. In the graphs 1100, which could correlate with the example of FIG. 8 according to the first embodiment, we are using a PMOS for the $M_{FB}$, and, therefore, the voltage magnitude of $V_{FBset}<V_{FBreset}$ to generate a higher $V_{GS}=(V_{FB}-VHH)$ for the set case. The middle section of the FIG. 11 shows the corresponding exemplary current through the $M_{FB}$ device. $I_{MFBset}>I_{MFBreset}$. As PMOS currents are shown here, the values are negative. The bottom section of FIG. 11 shows the output of the sense amplifier, such as the sense amplifier 903 of FIG. 9, taken at the output node of latch 905 (corresponding to the 'sense data' node in FIG. 9). The sense data node resolves to '1' for reading a set cell and resolves to '0' for reading a reset cell.

According to a second embodiment, as will be explained further below with respect to the example circuitry of FIG. 12, instead of using a drop in the voltage at blvdm for sensing a state of the cell as would have been done in a non-feedback scheme, such as the one in FIG. 7A, an effective current comparison between a reference current $I_{REF}$ and a mirror current $I_{MFBmirror}$ may be used as a basis to sense the state of the cell as will be explained in further detail below. In the feedback scheme, unlike blvdm, $V_{FB}$ tends to vary appreciably between a thresholded state cell and non thresholded state of the cell. The gate to source voltage $V_{GS}$ that supports the current $I_{MFB}$ may be given by $V_{FB}$–VHH, which is the $V_{GS}$ of $M_{FB}$. This same gate to source voltage $V_{GS}$ is applied in FIG. 12 to a the $M_{FBmirror}$ of mirror reference circuit 1235 to generate an $I_{MFBmirror}$ that tracks the $I_{MFB}$ in circuit 734. Because of the change in $V_{FB}$ between a thresholded state and a non-thresholded state, $I_{MFB}$ and $I_{MFBmirror}$ will also change proportionally based on whether we are in a thresholded state or non-thresholded state, and may be compared with a reference current $I_{REF}$ according to an embodiment to sense a logic state of a memory cell.

Figure 12:
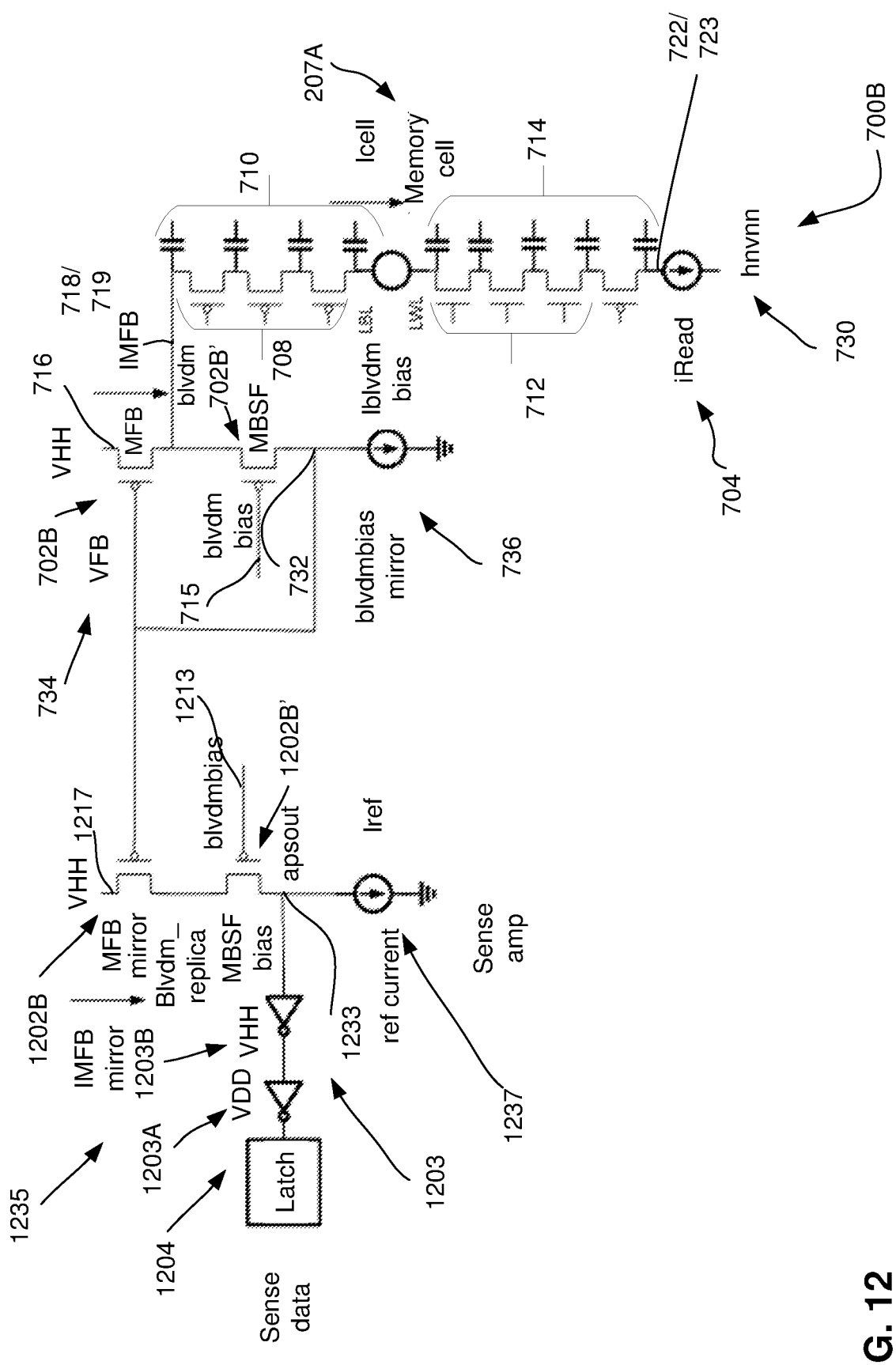
FIG. 12 shows a memory circuitry to provide a current sensing of a memory cell in the VDM SF scheme of FIG. 7B according to a first embodiment.

Referring now in particular to FIG. 12, an example memory circuitry 1200 according to the first embodiment is shown, where the memory circuitry 700B of FIG. 7B is provided with a mirror reference circuit 1235 including a mirror reference generation circuit 1203 and a sense circuitry 1204. In the embodiment of FIG. 12, the mirror reference generation circuit 1203 may include a mirror of the feedback circuit 734, including two PMOS transistors 1202B and 1202B' connected in series, with $M_{FBmirror}$ 1202B being a mirror of $M_{FB}$ 702B, and $M_{BSFBias}$ 1202B' being a mirror of $M_{BSF}$ 702B'. Source terminal 1217 of PMOS $M_{FBmirror}$ 1202B is connected to a positive rail, for example VHH, similar to source terminal 716 of $M_{FB}$ 702B. $M_{BSFBias}$ 1202B' has a drain 1233 which provides an input to sense circuitry 1204 to allow a sensing of the logic state of memory cell 207A as will be explained in further detail below. The gate 1213 of $M_{BSFBias}$ is at the blvdmbias voltage $V_{blvdmbias}$. A reference mirror current generation circuitry 1237 is also provided and connected to the drain 1233 at one end thereof, and to ground at another end thereof. The second embodiment provides for the application of a reference current $I_{REF}$ to the path through PMOS transistors 1202B and 1202B'. In the meantime, similar to the feedback circuit 734, VHH is shown as having been applied at source terminal 1217 of $M_{FBmirror}$ 1202B, $V_{blvdmbias}$ at gate 1213 of $M_{BSFBias}$ 1202B', and $V_{FB}$ to the gate of $M_{FBmirror}$ 1202B. Because the $V_{GS}$ of $M_{FBmirror}$ 1202B is the same as the $V_{GS}$ of $M_{FB}$ 702B, and because the $V_{GS}$ of $M_{BSFBias}$ 1202B' is the same as the $V_{GS}$ of $M_{BSF}$ 702B', the current generated through $M_{FB}$ mirror 1202B and $M_{BSFBias}$ 1202B' would track the current $I_{MFB}$ in circuit 700B. Thus, because circuit 1235 is a mirror of circuit 734, and further by virtue of the applied voltages VHH, $V_{FB}$ from the circuit 700B (which $V_{FB}$ is a function of $I_{MFB}$ which depends on whether the cell 207A is set for reset), and $V_{blvdmbias}$ being the same for both circuitries 1234 and 1235, any variations in $I_{MFBmirror}$ in circuit 1235 are expected to track variations in $I_{MFB}$ in circuit 734, not only by virtue of whether the cell is thresholded or not thresholded, but also any further variations by virtue of process, voltage and/or temperature (PVT) variations possible in the active VDM scheme of circuit 700B. The value of $I_{MFB}$ and $I_{MFBmirror}$ depend on $V_{FB}$, which can vary measurably depending on PVT variations, asides from varying based on whether the memory cell 207A is set or reset. At the same time, the reference mirror current generation circuit 1237 applies a known reference current $I_{REF}$ to drain node 1233.

FIG. 12 thus shows a mechanism to implement a method involving a current sensing scheme with the active VDM architecture as shown in FIG. 8. $M_{FBmirror}$ is the exact copy of $M_{FB}$, and $M_{BSFBias}$ is exact copy of $M_{BSF}$. A design choice in this second embodiment as suggested above is to keep $M_{FB}$, $M_{FBmirror}$, $M_{BSFBias}$ and $M_{BSF}$ in saturation all the time. Given that blvdmbias voltage is applied to both $M_{BSF}$ and $M_{BSFBias}$ devices, it guarantees that 'blvdm' and 'blvdm replica' are at the same potential, noting that Iblvdmbias=$I_{REF}$. Now $V_{GS}$ of MFB=$V_{GS}$ of $M_{FBmirror}$ as noted above, and VDS of $M_{FB}$=VDS of $M_{FBmirror}$. Hence, in the shown configuration of FIG. 12, four devices act as current mirror and $M_{FBmirror}$ copies current from the $M_{FB}$ device.

Referring back to Equation 1, for example, reading a SLC set cell, $I_{MFB}$=35 uA, and a SLC reset cell, $I_{MFB}$=12 uA. We may therefore, according to one embodiment, and as suggested above, set $I_{REF}$ in between set $I_{MFB}$ and reset $I_{MFB}$ currents. In the above example we can set up $I_{REF}$=24 uA.

In particular, in the shown scheme of circuit 1235, reference mirror current generation circuitry 1237 may be used to apply a reference current $I_{REF}$ to the path through transistors $M_{FBmirror}$ 1202B and $M_{BSFBias}$ 1202B'. In this case, as between $I_{REF}$ applied by reference mirror current generation circuit 1237 at node 1233, and $I_{MFBmirror}$ generated at node 1217 by virtue of the respective $V_{GS}'$ of $M_{FBmirror}$ 1202B and $M_{BSFBias}$ 1202B', the largest current would be the current flowing through path 1217 to 1233. A difference between $I_{MFBmirror}$ on the one hand and $I_{REF}$ on the other ($I_{REF}$ may, according to one example, be fixed), would substantially track a difference between $I_{MFB}$ and $I_{REF}$. $I_{MFB}$ however is dependent on whether the memory cell 207A is set (thresholded) or reset (prethreshold). Thus, whether the current at node 1233 is $I_{REF}$ or different from $I_{REF}$ would be dependent on whether the memory cell 207A is set or preset. For a set cell, $I_{MFB}>I_{REF}$, and the output voltage of the reference circuit is $V_{apsout}$=VHH, in which case the sense circuitry 1204 would read the sense data as logic state '1'. For a reset cell: $I_{MFB}<I_{REF}$, apsout=ground, sense data='0'. Sense circuitry 1204 therefore provides a current sensing scheme employed with the reference scheme of circuit 700B in order to create a sensing scheme that is reliable for sensing a logic state of the memory cell, and stable by virtue of not being susceptible to PVT variations. Sense circuitry 1204 may, according to one embodiment, include one or more inverters, such as inverters 1203A and 1204B as shown.

There will be some local mismatch in the devices but if signal is higher than the noise then we can transform analog voltage to correct digital output.

Referring still to FIG. 12, a latch arrangement 1205 is shown as coupled to sense circuitry 1204. A differential input signal from a comparison of may be converted to digital signal (logic '1' or '0') and stored in the data latch 1205 as sense data. The latch 1205 is shown coupled to the output of the comparator or sense circuitry 1204 to store the output of the read operation. In some embodiments, leakage components of the current can be mitigated by respectively selecting a bias for all other unselected wordlines and bitlines that reduces or minimizes leakage. Capacitive components of the current can be mitigated by allowing sufficient time for the capacitive components to dissipate.

According to some embodiments, there may be a sense circuitry similar to sense circuitry 1204 such as a sense amplifier, provided for each matrix of arrays. Referring back to FIG. 1 for example, each partition 122 may have 128 such matrices, hence 128 sense amplifiers. Each partition may be read from one read operation.

According to one embodiment, the mirror reference generation circuit 1235 of the first embodiment as shown by way of example in FIG. 12 may be associated with a dedicated sense circuitry, or it can be shared by multiple sense circuitries (for example 128 sense circuitries, or multiples of 128 sense circuitries).

Reference is made again back to FIG. 10 shows the example graph 1000 plotting current $I_{MFB}$ versus $V_{DS}$ for $M_{FB}$. Recall from Equation 2 above that $I_{DS} \propto |V_{GS}|$. Referring back in addition to Equation 1 above, a read operation may include reading a SLC set cell using an $I_{MFB}$ at set, such as an $I_{MFB}$=35 µA, and a SLC reset cell using an $I_{MFB}$ at reset, such as $I_{MFB}$=12 µA. According to one embodiment, the reference current $I_{REF}$ to be generated by reference current generation circuit 1237 may be set to a value in between the 'set $I_{MFB}$' value, or thresholded $I_{MFB}$ value ($I_{MFB}$ when the cell has been thresholded and a larger current is flowing through the cell, or $I_{MFBset}$), and the 'reset $I_{MFB}$' or non-thresholded $I_{MFB}$ ($I_{MFB}$ when the cell has not been thresholded and only a leakage current is flowing through the cell, or $I_{MFBreset}$) For example, $I_{REF}$ may be selected to be about halfway between $I_{MFBset}$ and $I_{MFBreset}$. In the above example, we can set up $I_{REF}$=24 µA. This latter example is shown in FIG. 10.

Simulation Result for Current Sensing

Figure 13:
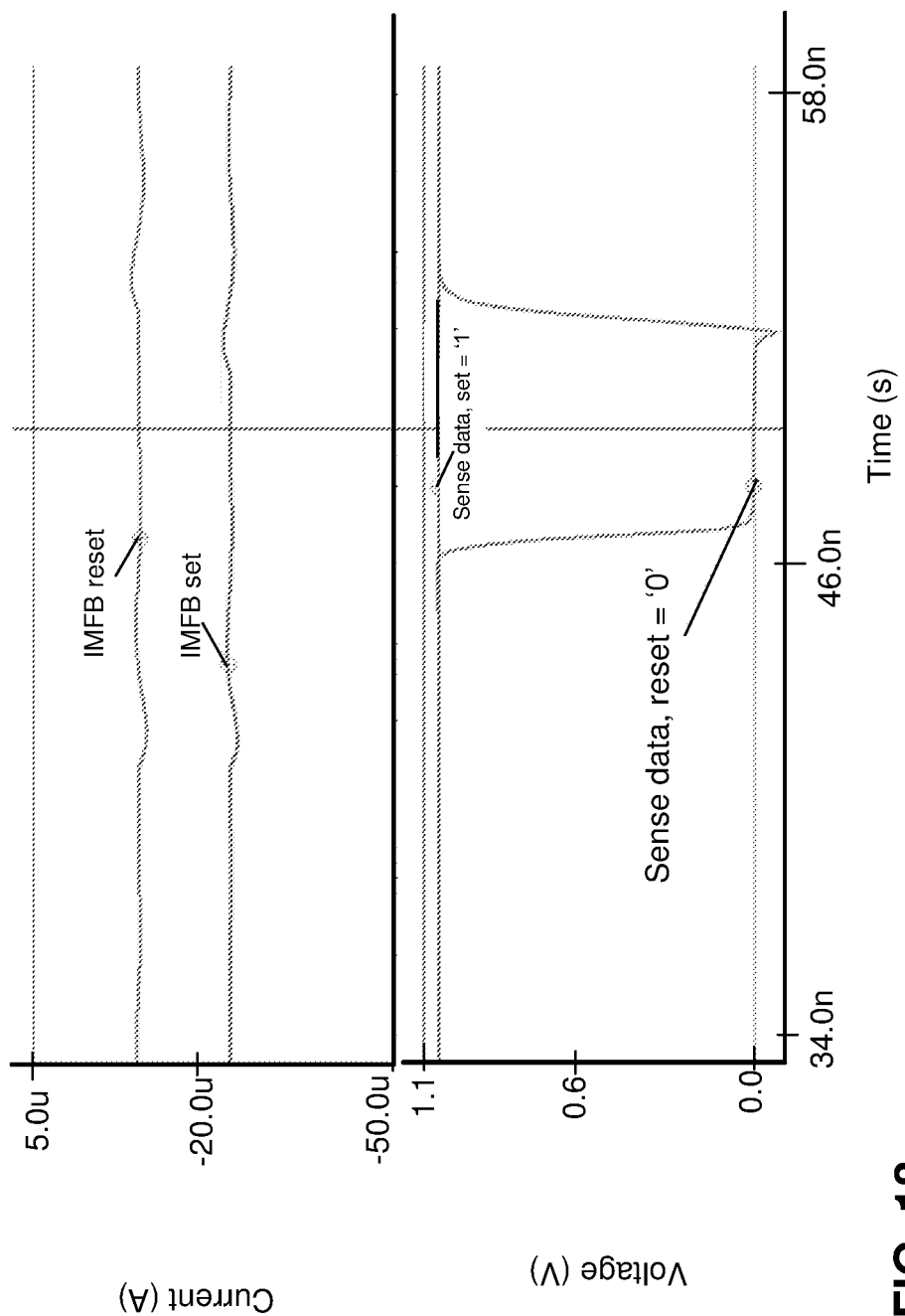
FIG. 13 shows graphs corresponding to transient simulation results for current sensing according to the first embodiment as shown in FIG. 8

Reference is now made to FIG. 13, which shows graphs 1300 corresponding to transient simulation results for current sensing with an active blvdm scheme. Sensing is performed on both set and reset cell, where a reset cell shows a lower current and where the sense data is at logic '0' and where a set cell has higher current and resolves to a logic state '1'. The top graph shows the $I_{DS}$ current through $I_{MFB}$ for set and reset scenarios, where the current is measured through $M_{FB}$, hence the negative numbers. The bottom graph shows an output of the sense circuitry in the form of sense data, which is '1' for reading a set cell and '0' for reading a reset cell.

An advantage of mirror reference voltage or reference current generation according to embodiments is that it allows a tracking of process, voltage, temperature (PVT) variations in an active VDM scheme. Such tracking allows the implementation of a differential voltage sensing scheme or of a differential current sending scheme which may be employed with the reference scheme, such as the one shown in FIG. 7B, to create a stable sensing for a memory device, such as a 3D Cross-Point memory device. A current mirror architecture is designed to copy current from active VDM SF devices. A current comparator is used to compare current through active VDM SF and a reference current and analog current signal is converted to digital signal.

Although the embodiments above describe the provision of reference circuitries at one BL node of a memory cell, it is to be understood that such reference circuitries may be provided according to some embodiments to allow voltage based sensing or current based sensing of memory cells at respective BL nodes of memory cells of memory arrays of a memory circuitry, or that such reference circuitries may be shared among a number of bitline nodes according to some embodiments to allow voltage based sensing or current based sensing of memory cells. Some embodiments further encompass providing reference circuitries at each respective WL of a memory array, or to be shared between a set of WLs of a memory array.

Essentially, reference circuitries are to be provided at one of the BL or WL nodes where sensing is provided. Thus, in either case, the concept in FIGS. 8-14 is to apply the circuitry on the side of the memory cell to which the sensing circuitry is connected.

Figure 14:
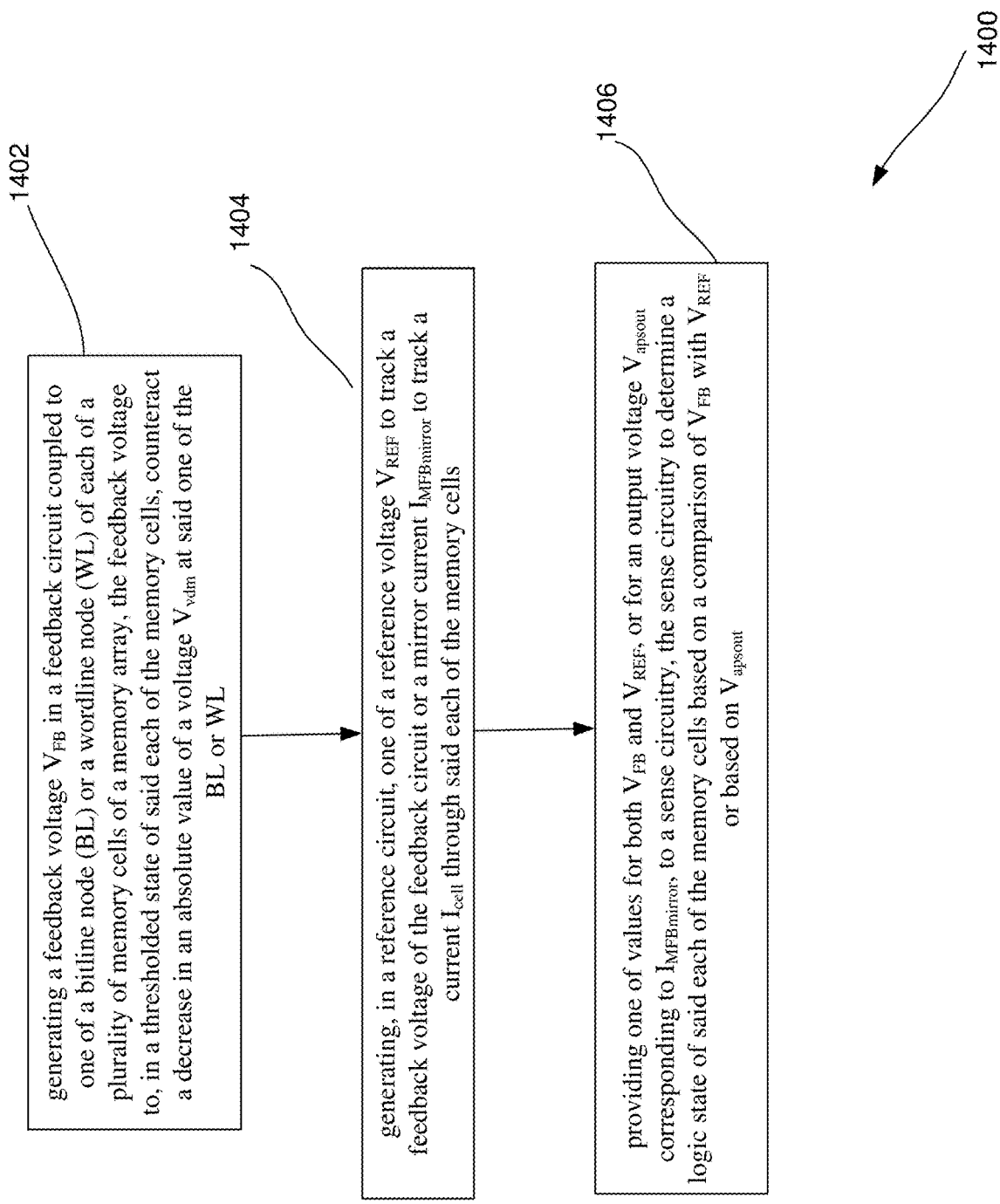
FIG. 14 illustrates an example process according to a first embodiment.

FIG. 14 illustrates an example of a process 1400 according to some embodiments. The process includes, at operation 1402, generating a feedback voltage $V_{FB}$ in a feedback circuit coupled to one of a bitline node (BL) or a wordline node (WL) of each of a plurality of memory cells of a memory array, the feedback voltage to, in a thresholded state of said each of the memory cells, counteract a decrease in an absolute value of a voltage $V_{vdm}$ at said one of the BL or WL, at operation 1404, generating, in a reference circuit, one of a reference voltage $V_{REF}$ to track a feedback voltage of the feedback circuit or a mirror current $I_{MFBmirror}$ to track a current $I_{cell}$ through said each of the memory cells and at operation 1406, providing one of values for both $V_{FB}$ and $V_{REF}$, or for an output voltage $V_{apsout}$ corresponding to $I_{MFBmirror}$, to a sense circuitry, the sense circuitry to determine a logic state of said each of the memory cells based on a comparison of $V_{FB}$ with $V_{REF}$ or based on $V_{apsout}$.

The flow described in FIG. 14 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 14 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 306, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a n integrated circuit of a memory module including: a memory array including memory cells to store binary logical states; and a memory access circuit coupled to each of the memory cells and including: a feedback circuit coupled to one of a bitline node (BL) or a wordline node (WL) of each of the memory cells and configured to, in a thresholded state of said each of the memory cells, counteract a decrease in an absolute value of a voltage $V_{vdm}$ at said one of the BL or WL, the feedback circuit to generate a feedback voltage $V_{FB}$ therein; and a reference circuit configured to generate one of a reference voltage $V_{REF}$ or a mirror current $I_{MFBmirror}$ therein, and configured such that one of $V_{REF}$ is to track a feedback voltage of the feedback circuit or $I_{MFBmirror}$ is to track a current $I_{cell}$ through said each of the memory cells; wherein the memory access circuit is to be coupled to sense circuitry to provide one of values for both $V_{FB}$ and $V_{REF}$, or for an output voltage $V_{apsout}$ corresponding to $I_{MFBmirror}$, to the sense circuitry to cause the sense circuitry to determine a logic state of said each of the memory cells.

Example 2 includes the subject matter of Example 1, and optionally, wherein: the feedback circuit includes a first feedback transistor and a second feedback transistor connected in series, wherein a drain of the first feedback transistor and a source of the second feedback transistor are coupled to said one of the BL or the WL and are to be at $V_{vdm}$, wherein $V_{FB}$ is to be generated at a drain of the second feedback transistor connected to a gate of the first feedback transistor, and wherein a gate of the second feedback transistor is to be at $V_{vdmbias}$; and the reference circuit includes a first reference transistor that is a replica of the first feedback transistor and a second reference transistor that is a replica of the second feedback transistor, the second reference transistor connected in series with the first reference transistor, wherein a gate of the second reference transistor is to be at $V_{vdmbias}$, and a drain of the second reference transistor is to be coupled to the sense circuitry to provide one of $V_{REF}$ or $V_{apsout}$ thereto.

Example 3 includes the subject matter of Example 2, and optionally, wherein: the feedback circuit includes a bias mirror current generation circuit coupled to the drain of the second feedback transistor to generate a current $I_{vdmbias}$, wherein a sum of $I_{cell}$ through said each of the memory cells and $I_{vdmbias}$ corresponds to a current $I_{MFB}$ through the first feedback transistor; and the reference circuit includes a reference mirror current generation circuit coupled to the drain of the second reference transistor to generate a current $I_{REF}$, wherein $I_{REF}=I_{vdmbias}$.

Example 4 includes the subject matter of Example 3, and optionally, wherein $I_{REF}$ is between $I_B$ when said each of the memory cells is thresholded ($I_{MFBset}$) and $I_{MFB}$ when said each of the memory cells is not thresholded ($I_{MFB}$ reset).

Example 5 includes the subject matter of Example 3, and optionally, wherein, when the sense circuitry is to determine a logic state of said each of the memory cells based on $V_{REF}$ and $V_{FB}$: a drain of the second reference transistor is connected to both a gate of the first reference transistor and to the reference mirror current generation circuit; and the drain of the second reference transistor at $V_{REF}$ is further to be connected as a second input to the sense circuitry, and a drain of the second feedback transistor at $V_{FB}$ is further to be connected as a first input to the sense circuitry.

Example 6 includes the subject matter of Example 3, and optionally, wherein when the sense circuitry is to determine a logic state of said each of the memory cells based on $V_{apsout}$, a gate of the first reference transistor is coupled to the gate of the first reference transistor and is to be at $V_{FB}$.

Example 7 includes the subject matter of Example 1, and optionally, further including the sense circuitry.

Example 8 includes the subject matter of Example 1, and optionally, further includes one or more latches coupled to the sense circuitry to store data corresponding to logic states of said each of the memory cells.

Example 9 includes the subject matter of Example 3, and optionally, further including a read current ($I_{Read}$) generation circuitry coupled to said each of the memory cells to generate a current $I_{Read}$ a BL side or WL side of said each of the memory cells, wherein the current $I_{cell}$ through the memory cell is based on $I_{Read}$.

Example 10 includes the subject matter of Example 2, and optionally, wherein the first feedback transistor, the second feedback transistor, the first reference transistor and the second reference transistor each include a metal oxide field effect (MOSFET) transistor.

Example 11 includes a system comprising: a memory array including memory cells to store binary logical states; sense circuitry coupled to the memory array, the sense circuitry including one or more controllers; a memory access circuit coupled to each of the memory cells and to the sense circuitry and including; and a feedback circuit coupled to one of a bitline node (BL) or a wordline node (WL) of each of the memory cells and configured to, in a thresholded state of said each of the memory cells, counteract a decrease in an absolute value of a voltage $V_{vdm}$ at said one of the BL or WL, the feedback circuit to generate a feedback voltage $V_{FB}$ therein; and a reference circuit configured to generate one of a reference voltage $V_{REF}$ or a mirror current $I_{MFBmirror}$ therein, and configured such that one of $V_{REF}$ is to track a feedback voltage of the feedback circuit or $I_{MFBmirror}$ is to track a current $I_{cell}$ through said each of the memory cells; wherein the memory access circuit is coupled to the sense circuitry to provide one of values for both $V_{FB}$ and $V_{REF}$, or for an output voltage $V_{apsout}$ corresponding to $I_{MFBmirror}$, to the sense circuitry, the sense circuitry to determine a logic state of said each of the memory cells based on a comparison of $V_{FB}$ with $V_{REF}$, or based on $V_{apsout}$.

Example 12 includes the subject matter of Example 11, and optionally, wherein: the feedback circuit includes a first feedback transistor and a second feedback transistor connected in series, wherein a drain of the first feedback transistor and a source of the second feedback transistor are coupled to said one of the BL or the WL and are to be at $V_{vdm}$, wherein $V_{FB}$ is to be generated at a drain of the second feedback transistor connected to a gate of the first feedback transistor, and wherein a gate of the second feedback transistor is to be at $V_{vdmbias}$; and the reference circuit includes a first reference transistor that is a replica of the first feedback transistor and a second reference transistor that is a replica of the second feedback transistor, the second reference transistor connected in series with the first reference transistor, wherein a gate of the second reference transistor is to be at $V_{vdmbias}$ and a drain of the second reference transistor is to be coupled to the sense circuitry to provide one of $V_{REF}$ or $V_{apsout}$ thereto.

Example 13 includes the subject matter of Example 12, and optionally, wherein: the feedback circuit includes a bias mirror current generation circuit coupled to the drain of the second feedback transistor to generate a current $I_{vdmbias}$, wherein a sum of $I_{cell}$ through said each of the memory cells and $I_{vdmbias}$ corresponds to a current $I_{MFB}$ through the first feedback transistor; and the reference circuit includes a reference mirror current generation circuit coupled to the drain of the second reference transistor to generate a current $I_{REF}$, wherein $I_{REF}=I_{vdmbias}$.

Example 14 includes the subject matter of Example 13, and optionally, further including a switch circuit comprising logic to control the bias mirror current generation circuit and the reference mirror current generation circuit to generate $I_{vdmbias}$ and $I_{REF}$, respectively.

Example 15 includes the subject matter of Example 13, and optionally, wherein $I_{REF}$ is between $I_{MFB}$ when said each of the memory cells is thresholded ($I_{MFBset}$) and $I_{MFB}$ when said each of the memory cells is not thresholded ($I_{MFB}$ reset).

Example 16 includes the subject matter of Example 13, and optionally, wherein, when the sense circuitry is to determine a logic state of said each of the memory cells based on $V_{REF}$ and $V_{FB}$: a drain of the second reference transistor is connected to both a gate of the first reference transistor and to the reference mirror current generation circuit; and the drain of the second reference transistor at $V_{REF}$ is further to be connected as a second input to the sense circuitry, and a drain of the second feedback transistor at $V_{FB}$ is further to be connected as a first input to the sense circuitry.

Example 17 includes the subject matter of Example 13, and optionally, wherein when the sense circuitry is to determine a logic state of said each of the memory cells based on $V_{apsout}$, a gate of the first reference transistor is coupled to the gate of the first reference transistor and is to be at $V_{FB}$.

Example 18 includes the subject matter of Example 11, and optionally, further including the sense circuitry.

Example 19 includes the subject matter of Example 11, and optionally, further includes one or more latches coupled to the sense circuitry to store data corresponding to logic states of said each of the memory cells.

Example 20 includes the subject matter of Example 13, and optionally, further including a read current ($I_{Read}$) generation circuitry coupled to said each of the memory cells to generate a current $I_{Read}$ a BL side or WL side of said each of the memory cells, wherein the current $I_{cell}$ through the memory cell is based on $I_{Read}$.

Example 21 includes the subject matter of Example 12, and optionally, wherein the first feedback transistor, the second feedback transistor, the first reference transistor and the second reference transistor each include a metal oxide field effect (MOSFET) transistor.

Example 22 includes a method comprising: generating a feedback voltage $V_{FB}$ in a feedback circuit coupled to one of a bitline node (BL) or a wordline node (WL) of each of a plurality of memory cells of a memory array, the feedback voltage to, in a thresholded state of said each of the memory cells, counteract a decrease in an absolute value of a voltage $V_{vdm}$ at said one of the BL or WL; generating, in a reference circuit, one of a reference voltage $V_{REF}$ to track a feedback voltage of the feedback circuit or a mirror current $I_{MFBmirror}$ to track a current $I_{cell}$ through said each of the memory cells; and providing one of values for both $V_{FB}$ and $V_{REF}$, or for an output voltage $V_{apsout}$ corresponding to $I_{MFBmirror}$, to a sense circuitry, the sense circuitry to determine a logic state of said each of the memory cells based on a comparison of $V_{FB}$ with $V_{REF}$ or based on $V_{apsout}$.

Example 23 includes the subject matter of Example 22, and optionally, wherein: generating $V_{FB}$ includes generating $V_{FB}$ at a drain of a second feedback transistor of a feedback circuit, the feedback circuit further including a first feedback transistor connected in series with the second feedback transistor, the drain of the second feedback transistor connected to a gate of the first feedback transistor; the method further includes: applying $V_{vdmbias}$ to a gate of the second feedback transistor and to a gate of a second reference transistor of a reference circuit, the reference circuit including a first reference transistor that is a replica of the first feedback transistor, the second reference transistor a replica of the second feedback transistor and connected in series with the first reference transistor; generating a $V_{vdm}$ at a drain of the first feedback transistor and at a source of the second feedback transistor; and providing one of $V_{REF}$ and $V_{FB}$, or $V_{apsout}$, to the sense circuitry by coupling a drain of the second reference transistor to the sense circuitry to cause the sense circuitry to determine a logic state of said one of the memory cells based on one of $V_{REF}$ and $V_{FB}$, or on $V_{apsout}$.

Example 24 includes the subject matter of Example 23, and optionally, wherein the method further includes: generating a bias mirror current $I_{vdmbias}$ at a drain of the second feedback transistor, wherein a sum of $I_{cell}$ through said each of the memory cells and $I_{vdmbias}$ corresponds to a current $I_{MFB}$ through the first feedback transistor; and generating a reference mirror current $I_{REF}$ at a drain of the second reference transistor, wherein $I_{REF}=I_{vdmbias}$.

Example 25 includes the subject matter of Example 24, and optionally, wherein generating $I_{vdmbias}$ and $I_{REF}$ includes controlling a bias mirror current generation circuit and a reference mirror current generation circuit to generate $I_{vdmbias}$ and $I_{REF}$, respectively.

Example 26 includes the subject matter of Example 24, and optionally, wherein $I_{REF}$ is between $I_{MFB}$ when said each of the memory cells is thresholded ($I_{MFBset}$) and $I_{MFB}$ when said each of the memory cells is not thresholded ($I_{MFBreset}$).

Example 27 includes the subject matter of Example 25, and optionally, wherein, when the sense circuitry is to determine a logic state of said each of the memory cells based on $V_{REF}$ and $V_{FB}$, the method includes generating $I_{REF}$ at a drain of the second reference transistor connected to a gate of the first reference transistor.

Example 28 includes the subject matter of Example 24, and optionally, wherein when the sense circuitry is to determine a logic state of said each of the memory cells based on $V_{apsout}$, a gate of the first reference transistor is coupled to the gate of the first reference transistor and is to be at $V_{FB}$.

Example 29 includes the subject matter of Example 22, and optionally, further including determining a logic state of said each of the memory cells.

Example 30 includes the subject matter of Example 22, and optionally, further including storing data corresponding to logic states of said each of the memory cells.

Example 31 includes the subject matter of Example 24, and optionally, further including generating a read current ($I_{Read}$) at said each of the memory cells, wherein the current $I_{cell}$ through the memory cell is based on $I_{Read}$.

Example 32 includes a non-transitory machine readable storage medium having instructions stored thereon, the instructions, when executed by a machine, to cause the machine to: generate a feedback voltage $V_{FB}$ in a feedback circuit coupled to one of a bitline node (BL) or a wordline node (WL) of each of a plurality of memory cells of a memory array, the feedback voltage to, in a thresholded state of said each of the memory cells, counteract a decrease in an absolute value of a voltage $V_{vdm}$ at said one of the BL or WL; generate, in a reference circuit, one of a reference voltage $V_{REF}$ to track a feedback voltage of the feedback circuit or a mirror current $I_{MFBmirror}$ to track a current $I_{cell}$ through said each of the memory cells; and provide one of values for both V and $V_{REF}$, or for an output voltage $V_{apsout}$ corresponding to $I_{MFBmirror}$, to a sense circuitry, the sense circuitry to determine a logic state of said each of the memory cells based on a comparison of V with $V_{REF}$ or based on $V_{apsout}$.

Example 33 includes the subject matter of Example 32, and optionally, wherein: generating $V_{FB}$ includes generating $V_{FB}$ at a drain of a second feedback transistor of a feedback circuit, the feedback circuit further including a first feedback transistor connected in series with the second feedback transistor, the drain of the second feedback transistor connected to a gate of the first feedback transistor; the instructions are to further cause the machine to: apply $V_{vdmbias}$ to a gate of the second feedback transistor and to a gate of a second reference transistor of a reference circuit, the reference circuit including a first reference transistor that is a replica of the first feedback transistor, the second reference transistor a replica of the second feedback transistor and connected in series with the first reference transistor; generate a $V_{vdm}$ at a drain of the first feedback transistor and at a source of the second feedback transistor; and provide one of $V_{REF}$ and $V_{FB}$, or $V_{apsout}$, to the sense circuitry by coupling a drain of the second reference transistor to the sense circuitry to cause the sense circuitry to determine a logic state of said one of the memory cells based on one of $V_{REF}$ and $V_{FB}$, or on $V_{apsout}$.

Example 34 includes the subject matter of Example 33, and optionally, the instructions to further cause the machine to: generate a bias mirror current $I_{vdmbias}$ at a drain of the second feedback transistor, wherein a sum of $I_{cell}$ through said each of the memory cells and $I_{vdmbias}$ corresponds to a current $I_{MFB}$ through the first feedback transistor; and generate a reference mirror current $I_{REF}$ at a drain of the second reference transistor, wherein $I_{REF}=I_{vdmbias}$.

Example 35 includes the subject matter of Example 34, and optionally, the instructions to further cause the machine to generate $I_{vdmbias}$ and $I_{REF}$ by controlling a bias mirror current generation circuit and a reference mirror current generation circuit, respectively.

Example 36 includes the subject matter of Example 34, and optionally, wherein $I_{REF}$ is between $I_{MFB}$ when said each of the memory cells is thresholded ($I_{MFBset}$) and $I_{MFB}$ when said each of the memory cells is not thresholded ($I_{MFBreset}$).

Example 37 includes the subject matter of Example 34, and optionally, wherein, when the sense circuitry is to determine a logic state of said each of the memory cells based on $V_{REF}$ and $V_{FB}$, the instructions are to further cause the machine to generate $I_{REF}$ by generating $I_{REF}$ at a drain of the second reference transistor connected to a gate of the first reference transistor.

Example 38 includes the subject matter of Example 34, and optionally, wherein when the sense circuitry is to determine a logic state of said each of the memory cells based on $V_{apsout}$, a gate of the first reference transistor is coupled to the gate of the first reference transistor and is to be at $V_{FB}$.

Example 39 includes the subject matter of Example 32, and optionally, the instructions to further cause the machine to determine a logic state of said each of the memory cells.

Example 40 includes the subject matter of Example 32, and optionally, the instructions to further cause the machine to store data corresponding to logic states of said each of the memory cells.

Example 41 includes the subject matter of Example 34, and optionally, the instructions to further cause the machine to generate a read current ($I_{Read}$) at said each of the memory cells, wherein the current $I_{cell}$ through the memory cell is based on $I_{Read}$.

Example 42 includes an device comprising: one or more processors and one or more computer-readable media comprising instructions that, when executed by the one or more processors, cause the one or more processors to perform the method, techniques, or process as described in or related to any of the Examples above, or portions thereof.

Example 43 includes a signal as described in or related to any of the Examples above, or portions or parts thereof Example 44 includes a datagram, packet, frame, segment, protocol data unit (PDU), or message as described in or related to any of the Examples above, or portions or parts thereof, or otherwise described in the present disclosure.

Example 45 includes a signal encoded with data as described in or related to any of the Examples above, or portions or parts thereof, or otherwise described in the present disclosure.

Example 46 includes a signal encoded with a datagram, packet, frame, segment, protocol data unit (PDU), or message as described in or related to any of the Examples above, or portions or parts thereof, or otherwise described in the present disclosure.

Example 47 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 48 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An integrated circuit of a memory module including:
   a memory array including memory cells to store binary logical states; and
   a memory access circuit coupled to each of the memory cells and including:
   a feedback circuit coupled to one of a bitline node (BL) or a wordline node (WL) of each of the memory cells and configured to, in a thresholded state of said each of the memory cells, counteract a decrease in an absolute value of a voltage $V_{vdm}$ at said one of the BL or WL, the feedback circuit to generate a feedback voltage $V_{FB}$ therein, wherein the feedback circuit includes a first feedback transistor and a second feedback transistor connected in series, wherein a drain of the first feedback transistor and a source of the second feedback transistor are coupled to said one of the BL or the WL and are to be at $V_{vdm}$, wherein $V_{FB}$ is to be generated at a drain of the second feedback transistor connected to a gate of the first feedback transistor, and wherein a gate of the second feedback transistor is to be at $V_{vdmbias}$; and
   a reference circuit configured to generate one of a reference voltage $V_{REF}$ or a mirror current $I_{MFBmirror}$ therein, and configured such that one of $V_{REF}$ is to track a feedback voltage of the feedback circuit or $I_{MFBmirror}$ is to track a current $I_{cell}$ through said each of the memory cells;
   wherein the memory access circuit is to be coupled to sense circuitry to provide one of values for both $V_{FB}$ and $V_{REF}$, or for an output voltage $V_{apsout}$ corresponding to $I_{MFBmirror}$, to the sense circuitry to cause the sense circuitry to determine a logic state of said each of the memory cells.

2. The integrated circuit of claim 1, wherein:
   the reference circuit includes a first reference transistor that is a replica of the first feedback transistor and a second reference transistor that is a replica of the second feedback transistor, the second reference transistor connected in series with the first reference transistor, wherein a gate of the second reference transistor is to be at $V_{vdmbias}$, and a drain of the second reference transistor is to be coupled to the sense circuitry to provide one of $V_{REF}$ or $V_{apsout}$ thereto.

3. The integrated circuit of claim 2, wherein:
   the feedback circuit includes a bias mirror current generation circuit coupled to the drain of the second feedback transistor to generate a current $I_{vdmbias}$, wherein a sum of $I_{cell}$ through said each of the memory cells and $I_{vdmbias}$ corresponds to a current $I_{MFB}$ through the first feedback transistor; and
   the reference circuit includes a reference mirror current generation circuit coupled to the drain of the second reference transistor to generate a current $I_{REF}$, wherein $I_{REF}=I_{vdmbias}$.

4. The integrated circuit of claim 3, wherein $I_{REF}$ is between $I_{MFB}$ when said each of the memory cells is thresholded ($I_{MFBset}$) and $I_{MFB}$ when said each of the memory cells is not thresholded ($I_{MFBreset}$).

5. The integrated circuit of claim 3, wherein, when the sense circuitry is to determine a logic state of said each of the memory cells based on $V_{REF}$ and $V_{FB}$:
   a drain of the second reference transistor is connected to both a gate of the first reference transistor and to the reference mirror current generation circuit; and
   the drain of the second reference transistor at $V_{REF}$ is further to be connected as a second input to the sense circuitry, and a drain of the second feedback transistor at $V_{FB}$ is further to be connected as a first input to the sense circuitry.

6. The integrated circuit of claim 3, wherein when the sense circuitry is to determine a logic state of said each of the memory cells based on $V_{apsout}$, a gate of the first reference transistor is coupled to the gate of the first reference transistor and is to be at $V_{FB}$.

7. The integrated circuit of claim 1, further including the sense circuitry.

8. The integrated circuit of claim 1, further includes one or more latches coupled to the sense circuitry to store data corresponding to logic states of said each of the memory cells.

9. The integrated circuit of claim 3, further including a read current ($I_{Read}$) generation circuitry coupled to said each of the memory cells to generate a current $I_{Read}$ a BL side or WL side of said each of the memory cells, wherein the current $I_{cell}$ through the memory cell is based on $I_{Read}$.

10. The integrated circuit of claim 2, wherein the first feedback transistor, the second feedback transistor, the first reference transistor and the second reference transistor each include a metal oxide field effect (MOSFET) transistor.

11. A system comprising:
a memory array including memory cells to store binary logical states;
sense circuitry coupled to the memory array, the sense circuitry including one or more controllers; and
a memory access circuit coupled to each of the memory cells and to the sense circuitry and including:
a feedback circuit coupled to one of a bitline node (BL) or a wordline node (WL) of each of the memory cells and configured to, in a thresholded state of said each of the memory cells, counteract a decrease in an absolute value of a voltage $V_{vdm}$ at said one of the BL or WL, the feedback circuit to generate a feedback voltage $V_{FB}$ therein, wherein the feedback circuit includes a first feedback transistor and a second feedback transistor connected in series, wherein a drain of the first feedback transistor and a source of the second feedback transistor are coupled to said one of the BL or the WL and are to be at $V_{vdm}$, wherein $V_{FB}$ is to be generated at a drain of the second feedback transistor connected to a gate of the first feedback transistor, and wherein a gate of the second feedback transistor is to be at $V_{vdmbias}$; and
a reference circuit configured to generate one of a reference voltage $V_{REF}$ or a mirror current $I_{MFBmirror}$ therein, and configured such that one of $V_{REF}$ is to track a feedback voltage of the feedback circuit or $I_{MFBmirror}$ is to track a current $I_{cell}$ through said each of the memory cells;
wherein the memory access circuit is coupled to the sense circuitry to provide one of values for both $V_{FB}$ and $V_{REF}$, or for an output voltage $V_{apsout}$ corresponding to $I_{MFBmirror}$, to the sense circuitry, the sense circuitry to determine a logic state of said each of the memory cells based on a comparison of $V_{FB}$ with $V_{REF}$, or based on $V_{apsout}$.

12. The system of claim 11, wherein:
the reference circuit includes a first reference transistor that is a replica of the first feedback transistor and a second reference transistor that is a replica of the second feedback transistor, the second reference transistor connected in series with the first reference transistor, wherein a gate of the second reference transistor is to be at $V_{vdmbias}$, and a drain of the second reference transistor is to be coupled to the sense circuitry to provide one of $V_{REF}$ or $V_{apsout}$ thereto.

13. The system of claim 12, wherein:
the feedback circuit includes a bias mirror current generation circuit coupled to the drain of the second feedback transistor to generate a current $I_{vdmbias}$, wherein a sum of $I_{cell}$ through said each of the memory cells and $I_{vdmbias}$ corresponds to a current $I_{MFB}$ through the first feedback transistor; and
the reference circuit includes a reference mirror current generation circuit coupled to the drain of the second reference transistor to generate a current $I_{REF}$, wherein $I_{REF}=I_{vdmbias}$.

14. The system of claim 13, further including a switch circuit comprising logic to control the bias mirror current generation circuit and the reference mirror current generation circuit to generate $I_{vdmbias}$ and $I_{REF}$, respectively.

15. The system of claim 13, wherein $I_{REF}$ is between $I_{MFB}$ when said each of the memory cells is thresholded ($I_{MFBset}$) and $I_{MFB}$ when said each of the memory cells is not thresholded ($I_{MFBreset}$).

16. A method comprising:
generating a feedback voltage $V_{FB}$ in a feedback circuit coupled to one of a bitline node (BL) or a wordline node (WL) of each of a plurality of memory cells of a memory array, the feedback voltage to, in a thresholded state of said each of the memory cells, counteract a decrease in an absolute value of a voltage $V_{vdm}$ at said one of the BL or WL, wherein generating $V_{FB}$ includes generating $V_{FB}$ at a drain of a second feedback transistor of a feedback circuit, the feedback circuit further including a first feedback transistor connected in series with the second feedback transistor, the drain of the second feedback transistor connected to a gate of the first feedback transistor;
generating, in a reference circuit, one of a reference voltage $V_{REF}$ to track a feedback voltage of the feedback circuit or a mirror current $I_{MFBmirror}$ to track a current $I_{cell}$ through said each of the memory cells; and
providing one of values for both $V_{FB}$ and $V_{REF}$, or for an output voltage $V_{apsout}$ corresponding to $I_{MFBmirror}$, to a sense circuitry, the sense circuitry to determine a logic state of said each of the memory cells based on a comparison of $V_{FB}$ with $V_{REF}$ or based on $V_{apsout}$.

17. The method of claim 16, wherein:
the method further includes:
applying $V_{vdmbias}$ to a gate of the second feedback transistor and to a gate of a second reference transistor of a reference circuit, the reference circuit including a first reference transistor that is a replica of the first feedback transistor, the second reference transistor a replica of the second feedback transistor and connected in series with the first reference transistor;
generating a $V_{vdm}$ at a drain of the first feedback transistor and at a source of the second feedback transistor; and
providing one of $V_{REF}$ and $V_{FB}$, or $V_{apsout}$ to the sense circuitry by coupling a drain of the second reference transistor to the sense circuitry to cause the sense circuitry to determine a logic state of said one of the memory cells based on one of $V_{REF}$ and $V_{FB}$, or on $V_{apsout}$.

18. The method of claim 17, wherein the method further includes:
generating a bias mirror current $I_{vdmbias}$ at a drain of the second feedback transistor, wherein a sum of $I_{cell}$ through said each of the memory cells and $I_{vdmbias}$ corresponds to a current $I_{MFB}$ through the first feedback transistor; and
generating a reference mirror current $I_{REF}$ at a drain of the second reference transistor, wherein $I_{REF}=I_{vdmbias}$.

19. A non-transitory machine readable storage medium having instructions stored thereon, the instructions, when executed by a machine, to cause the machine to:
generate a feedback voltage $V_{FB}$ in a feedback circuit coupled to one of a bitline node (BL) or a wordline node (WL) of each of a plurality of memory cells of a memory array, the feedback voltage to, in a thresholded state of said each of the memory cells, counteract a decrease in an absolute value of a voltage $V_{vdm}$ at said one of the BL or WL, wherein generating $V_{FB}$ includes generating $V_{FB}$ at a drain of a second feedback transistor of a feedback circuit, the feedback circuit further including a first feedback transistor connected in series with the second feedback transistor, the drain of the second feedback transistor connected to a gate of the first feedback transistor;

generate, in a reference circuit, one of a reference voltage $V_{REF}$ to track a feedback voltage of the feedback circuit or a mirror current $I_{MFBmirror}$ to track a current $I_{cell}$ through said each of the memory cells; and provide one of values for both $V_{FB}$ and $V_{REF}$, or for an output voltage $V_{apsout}$ corresponding to $I_{MFBmirror}$, to a sense circuitry, the sense circuitry to determine a logic state of said each of the memory cells based on a comparison of $V_{FB}$ with $V_{REF}$ or based on $V_{apsout}$.

20. The storage medium of claim 19, wherein:

the instructions are to further cause the machine to:

apply $V_{vdmbias}$ to a gate of the second feedback transistor and to a gate of a second reference transistor of a reference circuit, the reference circuit including a first reference transistor that is a replica of the first feedback transistor, the second reference transistor a replica of the second feedback transistor and connected in series with the first reference transistor;

generate a $V_{vdm}$ at a drain of the first feedback transistor and at a source of the second feedback transistor; and provide one of $V_{REF}$ and $V_{FB}$, or $V_{apsout}$, to the sense circuitry by coupling a drain of the second reference transistor to the sense circuitry to cause the sense circuitry to determine a logic state of said one of the memory cells based on one of $V_{REF}$ and $V_{FB}$, or on $V_{apsout}$.

* * * * *